(12) United States Patent
Daghighian et al.

(10) Patent No.: US 9,306,546 B2
(45) Date of Patent: Apr. 5, 2016

(54) INTEGRATED POWER SUPPLY FOR FIBER OPTIC COMMUNICATION DEVICES AND SUBSYSTEMS

(71) Applicant: FINISAR CORPORATION, Sunnyvale, CA (US)

(72) Inventors: Henry M. Daghighian, Menlo Park, CA (US); Luke M Ekkizogloy, Mountain View, CA (US); The'Linh Nguyen, San Jose, CA (US); Christopher Kocot, San Carlos, CA (US); James Prettyleaf, Cupertino, CA (US)

(73) Assignee: FINISAR CORPORATION, Sunnyvale, CA (US)

( * ) Notice: Subject to any disclaimer, the term of this patent is extended or adjusted under 35 U.S.C. 154(b) by 47 days.

(21) Appl. No.: 13/761,036

(22) Filed: Feb. 6, 2013

(65) Prior Publication Data

US 2013/0200930 A1    Aug. 8, 2013

Related U.S. Application Data

(60) Provisional application No. 61/595,602, filed on Feb. 6, 2012.

(51) Int. Cl.
　　*H03K 17/00*　　(2006.01)
　　*H03K 3/013*　　(2006.01)
　　*H03K 7/08*　　(2006.01)
　　*H04B 10/40*　　(2013.01)

(52) U.S. Cl.
　　CPC .................. *H03K 3/013* (2013.01); *H03K 7/08* (2013.01); *H04B 10/40* (2013.01)

(58) Field of Classification Search
　　USPC .......................................................... 327/124
　　See application file for complete search history.

(56) References Cited

U.S. PATENT DOCUMENTS

| 6,323,709 | B1* | 11/2001 | Kulkarni et al. ............... 327/195 |
| 6,438,178 | B1* | 8/2002 | Lysdal et al. ................... 375/317 |
| 7,482,792 | B2* | 1/2009 | Burton et al. ................... 323/272 |
| 2003/0043611 | A1* | 3/2003 | Bockle et al. .................. 363/131 |
| 2008/0278979 | A1* | 11/2008 | Ortiz-Lopez et al. ........... 363/65 |
| 2009/0283825 | A1* | 11/2009 | Wang et al. .................... 257/335 |
| 2010/0001667 | A1* | 1/2010 | Galbiati ......................... 318/135 |
| 2010/0002473 | A1* | 1/2010 | Williams .................... 363/21.06 |
| 2010/0052760 | A1* | 3/2010 | Fujiwara ........................ 327/291 |
| 2011/0316494 | A1* | 12/2011 | Kitamura et al. .............. 323/229 |

OTHER PUBLICATIONS

Sedra et al. pp. 969, Microelectronic Circuits, fifth edition, Oxford University press, 2004.*
de Brito et al.,"New Integrated Zeta and Cuk Inverters Intended for Satnd-Alone and Grid-Connected Applications", IEEE Power Electronice Conference, 2011, pp. 657-663.*

(Continued)

*Primary Examiner* — Lincoln Donovan
*Assistant Examiner* — Patrick Chen
(74) *Attorney, Agent, or Firm* — Maschoff Brennan

(57) ABSTRACT

An example embodiment includes a fiber optic integrated circuit (IC). The fiber optic IC includes an integrated power supply. The integrated power supply includes a filter, an active switch, and a pulse width modulator ("PWM"). The filter is configured to convert a signal to an output signal of the integrated power supply. The active switch is configured to control introduction of the signal to the filter. The PWM is configured to generate a PWM output signal that triggers the active switch.

20 Claims, 15 Drawing Sheets

(56) References Cited

OTHER PUBLICATIONS

Yang, Boyi, et al. "Evaluation of Lateral Power MOSFETs in a Synchronous Buck Converter Using a Mixed-Mode Device and Circuit Simulation." IEEE Transactions on Electron Devices, vol. 58, No. 11. Nov. 2011. pp. 4004-4010.

Sorge, R., et al. "Complementary RF LDMOS Module for 12 V DC/DC Converter and 6 GHz Power Applications." IHP, IM Technologies 25, 15236 Frankfurt (Oder), Germany. 2011. pp. 57-60.

Warren, James R. "Transistor Selection and Design of a VHF DC-DC Power Converter." IEEE Transactions on Power Electronics, vol. 23, No. 1. Jan. 2008. pp. 27-37.

Morris, Ricky. "BCD platform technologies are rapidly changing the power IC landscape, says Petrov Group." Press release; DIGITIMES (Wednesday Mar. 3, 2010).

Karnick, Tanay, et al. "High-Frequency DC-DC Conversion: Fact or Fiction." IEEE International Symposium on Circuits and Systems, USA, 2006. pp. 245-248.

Roesler, Alexander W., et al. "Planar LTCC Transformers for High Voltage Flyback Converters." Sandia Report SAND2007-2591. Jun. 2007.

Gogineni, Usha, et al. "RF Power Potential of 45 nm CMOS Technology." IEEE 2010 Topical Meeting on Silicon Monolithic Integrated Circuits in RF Systems. 2010. pp. 204-207.

Galle, Preston, et al. "Ultra-Compact Power Conversion Based on a CMOS-Compatible Microfabricated Power Inductor with Minimized Core Losses." Electronic Components and Technology Conference. 2007. pp. 1889-1894.

Cullens, Evan, et al. "Miniature Bias-Tee Networks Integrated in Micro-coaxial Lines" IEEE European Microwave Conference, Sep. 28-30, 2010, Paris, France. pp. 413-416.

Nariman, Mohammad, et al. "A Switched-Capacitor mm-Wave VCO in 65 nm Digital CMOS." 2010 IEEE Radio Frequency Integrated Circuits Symposium. pp. 157-160.

Morrow, P.R., et al. "Three-Dimensional Wafer Stacking Via Cu-Cu Bonding Integrated With 65-nm Strained-Si/Low-$k$ CMOS Technology." IEEE Electron Device Letters, vol. 27, No. 5, May 2006. pp. 335-337.

Bianchi, R.A., et al. "High Voltage Devices integration into advanced CMOS technologies." IEEE International Electron Devices Meeting. Dec. 15-17, 2008.

Voinigescu, S.P., et al. "SiGe BiCMOS for Analog, High-Speed Digital and Millimetre-Wave Applications Beyond 50 GHz." IEEE Bipolar/BiCMOS Circuits and Technology Meeting. Canada. 2006. pp. 1-8.

Dongyue, Jin, et al. "Thermal Stability of the Power SiGe HBT with Non-uniform Finger Length." International Conference on Microwave and Millimeter Wave Technology, 2008, pp. 166-169.

Nakamura, Kazutoshi, et al. "10A 12V 1 chip digitally-controlled DC/DC converter IC with high resolution and high frequency DPWM." IEEE Power Electronics and Motion Control Conference, 2008. pp. 498-503.

Liang, Qingqing, et al. "A Physics-Based High-Injection Transit-Time Model Applied to Barrier Effects in SiGe HBTs." IEEE Transactions on Electron Devices, vol. 49, No. 10, Oct. 2002. pp. 1807-1813.

Vestling, Lars, et al. "Analysis and Design of a Low-Voltage High-Fregency LDMOS Transistor." IEEE Transactions on Electron Devices, vol. 49, No. 6, Jun. 2002. pp. 976-980.

Osten, H. Jörg, et al. "Carbon Doping of SiGe Heterobipolar Transistors."., IEEE 1998 Topical Meeting on Silicon Monolithic Integrated Circuits in RF Systems. Frankfurt (Oder) Germany. 1998. pp. 19-23.

Cheng, Peng, et al. "An Investigation of Low-Frequency Noise in Complementary SiGe HBTs on SOI." IEEE Bipolar/BiCMOS Circuit and Technology Meeting. 2010. pp. 165-168.

Hsieh, Yi-Keng, et al. "A 60 GHz Broadband Low-Noise Amplifier With Variagle-Gain Control in 65nn CMOS." IEEE Microwave and Wireless Components Letters, vol. 21, No. 11, Nov. 2011. pp. 610-612.

\* cited by examiner

INTEGRATED POWER SUPPLY FOR FIBER OPTIC COMMUNICATION DEVICES AND SUBSYSTEMS

CROSS-REFERENCE TO RELATED APPLICATION

This application claims the benefit of and priority to U.S. Provisional Application No. 61/595,602 filed on Feb. 6, 2012 which is incorporated herein by reference in its entirety.

BACKGROUND

1. Field

Some embodiments relate generally to electronic circuitry in communication devices. More particularly, example embodiments relate to circuits that may include integrated power supplies.

2. Related Technology

Communication modules, such as electronic or optoelectronic transceivers or transponder modules, are used in electronic and optoelectronic communication. Communication modules may include multiple components that operate at various voltages. However, communication modules may receive a source signal having a single voltage supplied by a host, for example. To supply the various voltages, the communication modules may include power converters that output the various voltages for the multiple components. The power converters may be discrete components. The power converters may take up volume within the communication modules. Additionally, the power converters may generate and/or propagate unwanted electromagnetic radiation.

The subject matter claimed herein is not limited to embodiments that solve any disadvantages or that operate only in environments such as those described above. Rather, this background is only provided to illustrate one exemplary technology area where some embodiments described herein may be practiced.

SUMMARY OF SOME EXAMPLE EMBODIMENTS

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter An example embodiment includes a fiber optic integrated circuit (IC). The fiber optic IC includes an integrated power supply. The integrated power supply includes a filter, an active switch, and a pulse width modulator ("PWM"). The filter is configured to convert a signal to an output signal of the integrated power supply. The active switch is configured to control introduction of the signal to the filter. The PWM is configured to generate a PWM output signal that triggers the active switch.

Another example embodiment includes a circuit. The circuit includes a substrate and an IC. The IC is mounted to the substrate. The IC includes an integrated power supply. The integrated power supply has a PWM, which is configured to generate a PWM output signal. The PWM output signal triggers an active switch to control introduction of a source signal through a filter. The filter modifies the source signal to generate an output signal of the integrated power supply.

Another example embodiment includes an optical subassembly. The optical subassembly includes a printed circuit board ("PCB") and a circuit. The circuit includes an IC mounted to a substrate. The IC includes an integrated power supply, which is configured to receive a source signal at an active switch from a host power supply and to output an output signal of the integrated power supply. The active switch is controlled by a PWM output signal generated by the PWM. The PWM is integrated into the IC. The PWM output signal has a frequency above 500 megahertz.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

It is to be understood that both the foregoing general description and the following detailed description are exemplary and explanatory and are not restrictive of the invention, as claimed.

BRIEF DESCRIPTION OF THE DRAWINGS

To further clarify the above and other advantages and features of the present invention, a more particular description will be rendered by reference to specific embodiments, which are illustrated in the appended drawings. It is appreciated that these drawings depict only some embodiments and are therefore not to be considered limiting of its scope. The invention will be described and explained with additional specificity and detail through the use of the accompanying drawings in which.

DETAILED DESCRIPTION OF SOME EXAMPLE EMBODIMENTS

Embodiments relate generally to electronic circuitry in communication devices. More particularly, example embodiments relate to circuits that may include integrated power supplies. In an example embodiment, a circuit includes an integrated circuit ("IC") that further includes an integrated power supply. The integrated power supply includes a pulse width modulator ("PWM") configured to generate a PWM output signal. The PWM output signal is configured to trigger an active switch. The active switch is configured to control the introduction of a source signal to the circuit. Some additional embodiments will be described with reference to the appended drawings.

Some embodiments described herein may be implemented in communication devices such as optoelectronic devices. As used herein, the term "optoelectronic device" includes a device having both optical and electrical components. Some examples of optoelectronic devices include, but are not limited to, transponders, transceivers, transmitters, and receivers. While some embodiments will be discussed in the context of a transceiver or an optoelectronic device, it should be appreciated with the benefit of this disclosure, that the principles presented herein may be implemented in other electronic devices having the functionality described below.

Figure 1A:
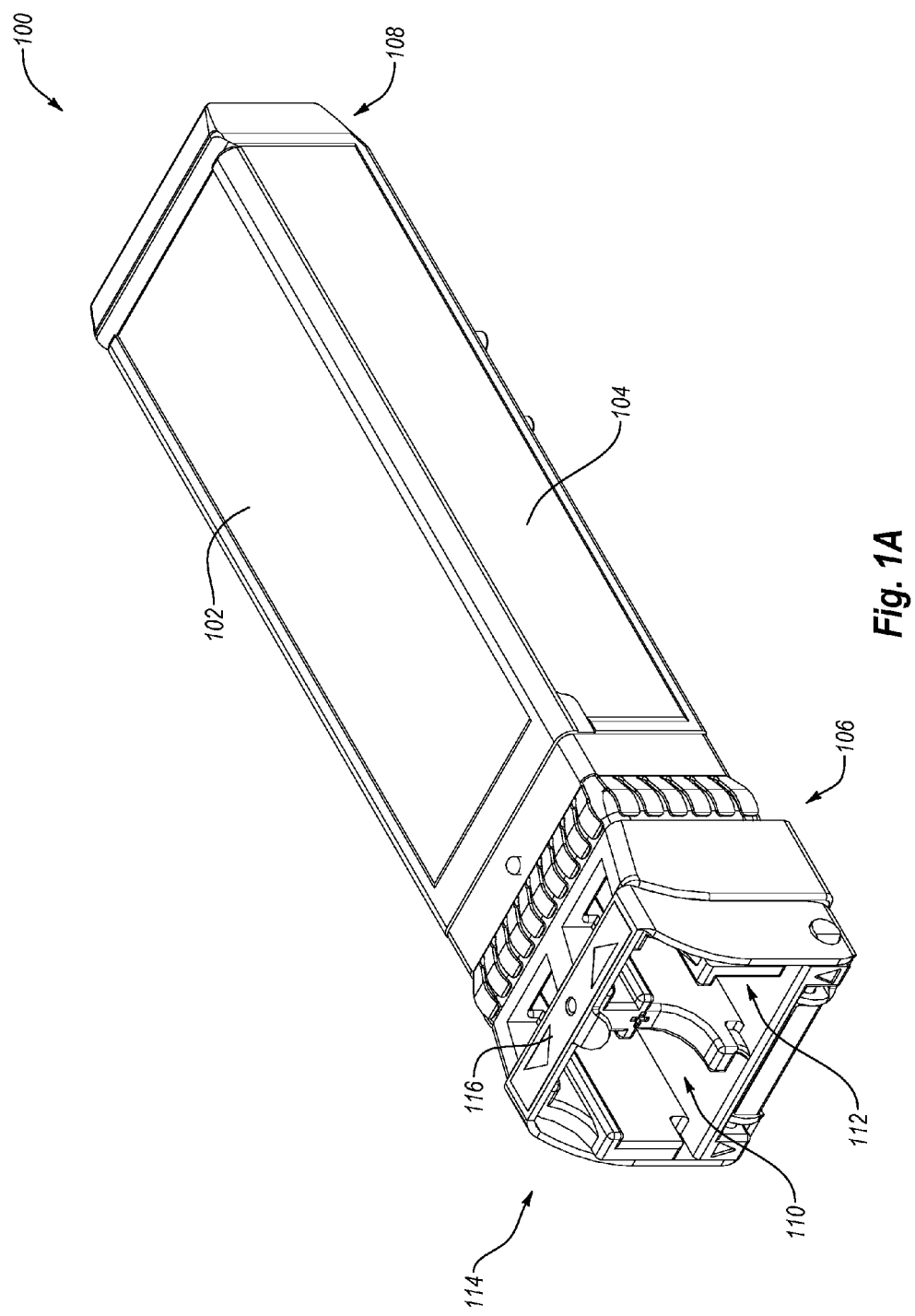
FIG. 1A is a perspective view of an example transceiver module ("transceiver") in which some embodiments described herein may be implemented.

FIG. 1A illustrates a perspective view of an example transceiver module ("transceiver") 100 in which a circuit including an integrated power supply as described herein may be implemented. Although not required in all embodiments, the transceiver 100 may be an SFP+ optical transceiver, meaning that the transceiver 100 may conform or substantially conform to the enhanced small form-factor pluggable (SFP+) multi-source agreement (MSA).

While described in some detail herein, the transceiver 100 is discussed by way of illustration only, and not by way of restricting the scope. For example, although the transceiver 100 may be an SFP+ optical transceiver in some embodiments, the principles of the invention can be implemented in optoelectronic devices of any form factor such as XFP, SFP, SFP+, SFF, XENPAK, and XPAK, without restriction. Alternatively or additionally, the transceiver 100 can be suitable for optical signal transmission and reception at a variety of per-second data rates, including but not limited to 1 gigabit per second ("Gbit"), 2 Gbit, 4 Gbit, 8 Gbit, 10 Gbit, 20 Gbit, or higher. Furthermore, optoelectronic devices of other types and configurations, or having components that differ in some respects from those shown and described herein, can also benefit from the principles disclosed herein.

As shown in FIG. 1A, the transceiver 100 includes a body composed of a top shell 102 and bottom shell 104. The bottom shell 104 defines a front end 106 and a back end 108 of the transceiver 100. Included on the front end 106 of the transceiver 100 are two optical ports 110 and 112 configured to receive connectors of an optical fiber (not shown). The two optical ports 110 and 112 include an output port 110 and an input port 112. The optical ports 110 and 112 define a portion of an interface portion 114 that is generally included on the front end 106 of the transceiver 100. The interface portion 114 can include structures to operably connect the transceiver 100 to optical fibers or optical fiber connectors such as LC connectors.

In addition, a bail latch assembly 116 may be positioned on the transceiver 100 front end 106. The bail latch assembly 116 enables the transceiver 100 to be removably secured in a host device (not shown). The body of the transceiver 100, including top shell 102 and bottom shell 104, can be formed of metal. Additionally, a host device may include a cage in which the transceiver 100 is inserted.

Figure 1B:
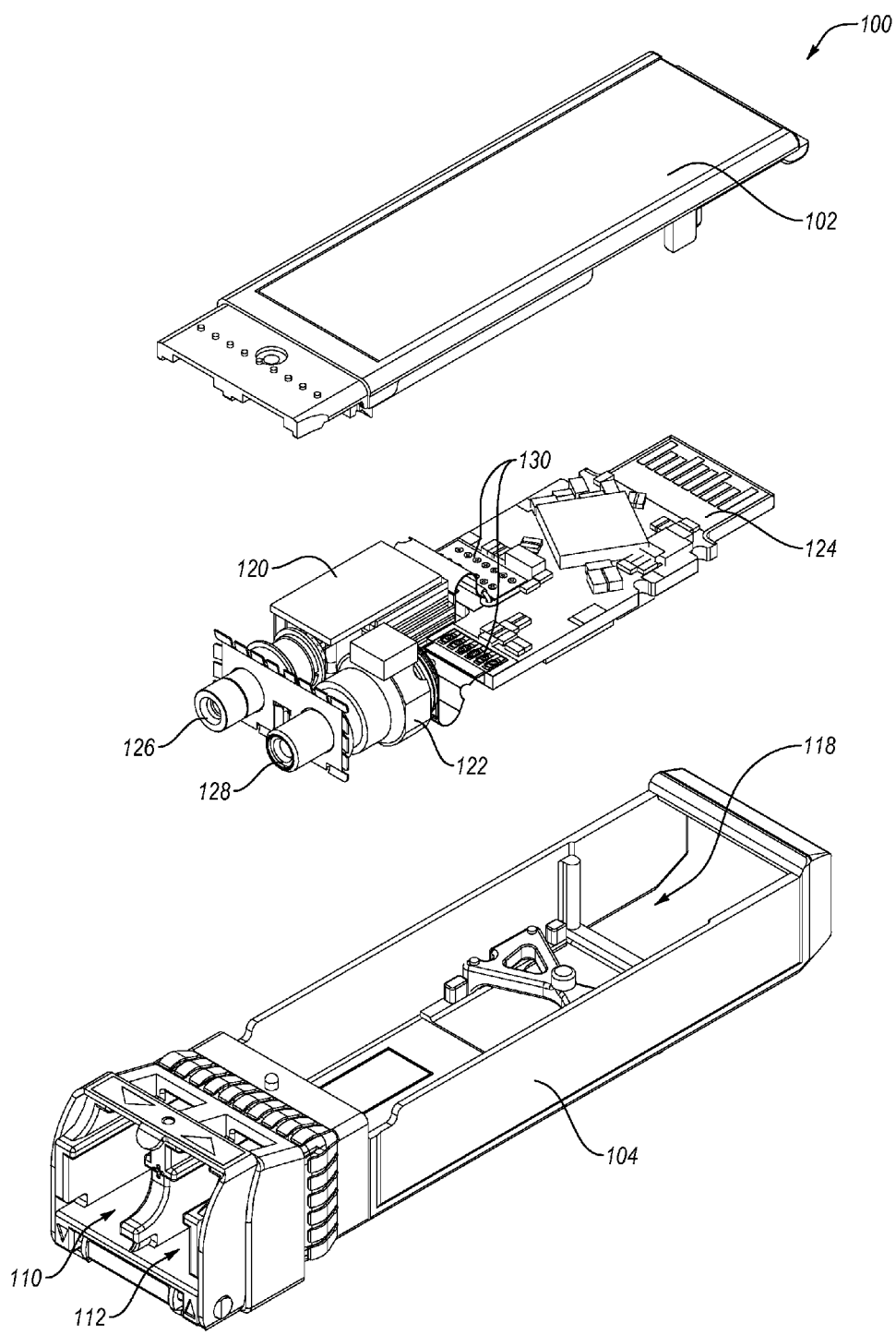
FIG. 1B is a partially exploded perspective view of the transceiver of FIG. 1A.

FIG. 1B illustrates a partially exploded perspective view of the transceiver 100 of FIG. 1A. In FIG. 1B, the bottom shell 104 defines a cavity 118 in which a TOSA 120, a ROSA 122, a printed circuit board ("PCB") 124, and PCB connectors 130 are included as internal components of the transceiver 100.

Each of the TOSA 120 and the ROSA 122 includes a port 126 and 128, respectively, that extends into a respective one of the optical ports 110 and 112 so as to be positioned to mate with an optical fiber (not shown) or a connector portion (not shown) of the optical fiber when received within optical ports 110 and 112. The TOSA 120 and the ROSA 122 can be electrically coupled to the PCB 124 via the PCB electric connectors 130. The PCB electric connectors 130 may include flexible circuit connectors or equivalent electrical contact(s) that allow the transmission of electrical signals between the PCB 124 and the TOSA 120 or between the PCB 124 and the ROSA 122.

During operation, the transceiver 100 can receive a data-carrying electrical signal from a host device for transmission as a data-carrying optical signal on an optical fiber. The host device may be any computing system capable of communicating with the transceiver 100. The electrical signal received from the host device can be provided to an optical transmitter, such as a laser (not shown) positioned within the TOSA 120, which converts the electrical signal into a data-carrying optical signal for transmission on an optical fiber and transmission via an optical communication network, for instance. The optical transmitter can include an edge-emitting laser diode, a Fabry-Perot ("FP") laser, a vertical-cavity surface-emitting laser ("VCSEL"), a distributed feedback ("DFB") laser, an electroabsorption modulated laser ("EML"), a Mach Zehnder modulator, or another suitable light source. Accordingly, the TOSA 120 can serve or include components that serve as an electro-optic transducer.

In addition, the transceiver 100 can receive a data-carrying optical signal from an optical fiber via the ROSA 122. The ROSA 122 can include an optical receiver, such as a photodiode or other suitable receiver, which transforms a received optical signal into a data-carrying electrical signal. Accordingly, the ROSA 122 can include components that serve as an opto-electric transducer. The resulting electrical signal can then be provided to the host device in which the transceiver 100 is located.

Figure 2:
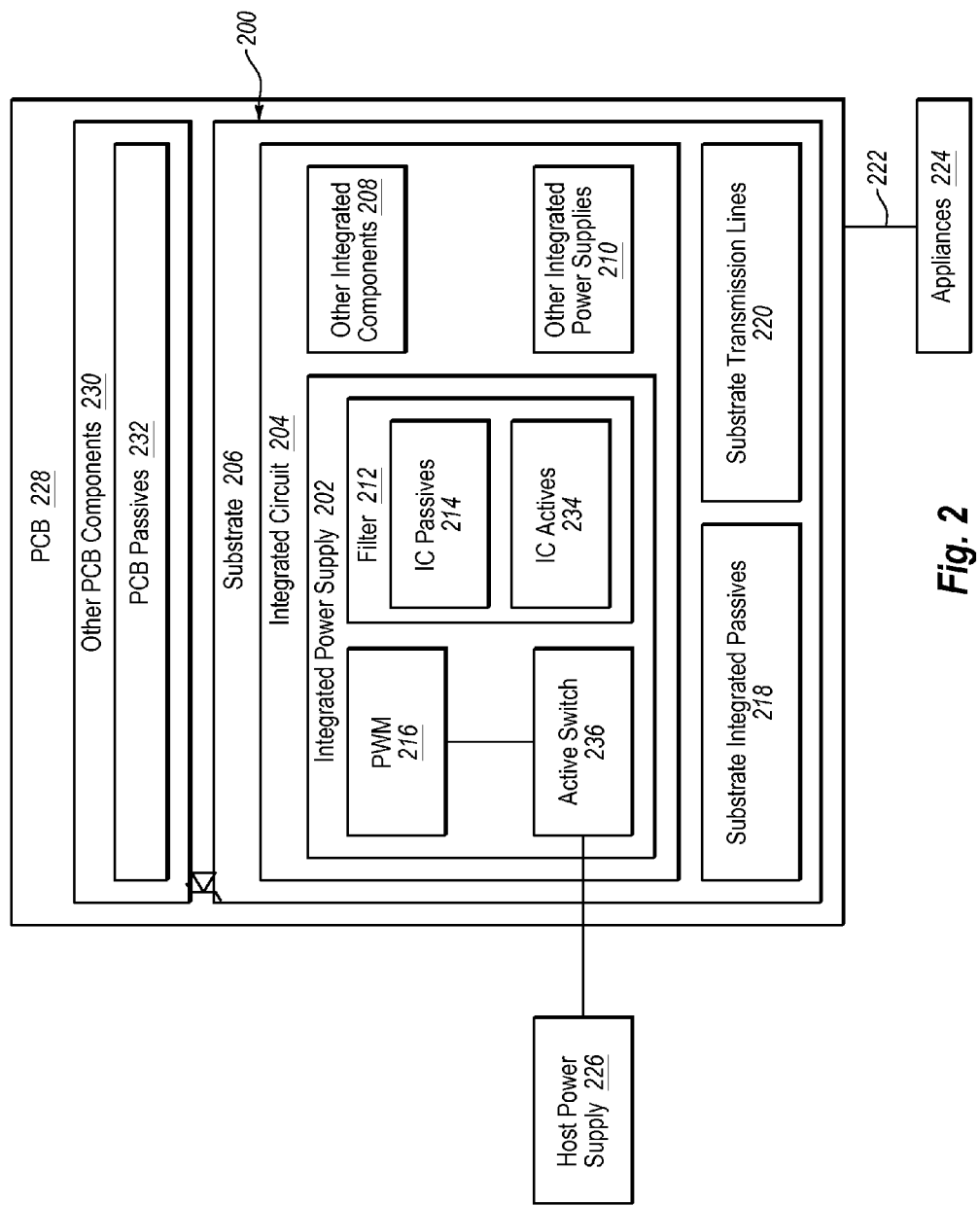
FIG. 2 illustrates a block diagram of an example circuit that may be implemented in the transceiver of FIGS. 1A and 1B.

FIG. 2 illustrates a block diagram of an example circuit 200 that may be implemented in the transceiver 100 of FIGS. 1A and 1B. For example, the circuit 200 may be mounted on a PCB 228, which may correspond in some embodiments to the PCB 124 of FIGS. 1A-1B, to perform one or more of the functions described herein. Generally, the circuit 200 may perform some function with respect to appliances 224 and/or other PCB components 230. Additionally or alternatively, the circuit 200 may communicate with the other PCB components 230 and/or the appliances 224 to perform some function. The appliances 224 may include, but are not limited to, active bias tees, lasers, receivers, transmitters, amplifiers, thermal electric coolers ("TEC"), attenuators, transponders, microcontrollers, host devices, or some combination thereof. The other PCB components 230 may include, but are not limited to, electrical circuits, microcontrollers, amplifiers, attenuators, clock circuits, or some combination thereof. For example, the circuit 200 may include a laser driver and the appliance 224 may include a laser. In this and other embodiments, the circuit 200 may perform the function of driving the laser.

Structurally, the circuit 200 may include an integrated circuit ("IC") 204 that may be mounted to a substrate 206. The IC 204 may be a monolithic chip. The monolithic chip may be composed of semiconductor materials with patterns of trace elements diffused into the semiconductor materials. The IC 204 may be constructed using various semiconductor technologies such as complementary metal-oxide-semiconductor ("CMOS"), Bipolar CMOS ("BiCMOS"), extended drain CMOS ("EDMOS"), orthogonal gate EDMOS ("OG EDMOS"), Silicon-Germanium ("SiGe") heterojunction bipolar transistor ("HBT"), or some combination thereof.

The IC 204 may be a mixed-signal IC. That is, the IC 204 may include analog circuits and digital circuits. In these and other embodiments, the above semiconductor technologies (e.g., CMOS, BiCMOS, EDMOS, OG EDMOS, and SiGe HBT) may be incorporated in separate portions of the IC 204.

For example, in some embodiments, SiGe HBT may not be utilized in an integrated power supply 202 included in the IC. However, SiGe HBT may be a bipolar leg of the BiCMOS integration technology in the IC 204. With this and other example configurations, the IC 204 may additionally or alternatively include active bias tees, step-down converters, step up converters, for example with the integrated power supply 202. Specifically, in some embodiments, the integrated power supply 202 and other integrated components 208 and/or IC passives 214 are integrated into the IC 204 having a BiCMOS environment.

The IC 204 may be a fiber optic IC. That is, the IC 204 may be used in fiber optic communication devices and subsystems such as the transceiver 100 of FIGS. 1A and 1B. For example, the IC 204 may include the integrated power supply 204 along with one or more other integrated components 208 associated with optical communication modules, electrical communication modules, host devices, etc.

The substrate 206 may be composed of a low temperature co-fired ceramic ("LTCC") or a liquid crystal polymer flex, for example. The mounting between the IC 204 and the substrate 206 may include a direct physical attachment, such as epoxy or a thick film technology, for instance. Alternatively, the IC 204 and the substrate 206 may utilize bumped die assemblies or copper pillar assemblies. By utilizing the bumped die assemblies or the copper pillar assemblies, some parasitics due to contact between the IC 204 and the substrate 206 may be reduced compared to mounting configurations in which the bumped die assemblies and/or the copper pillar assemblies are not used.

Alternatively, in some embodiments, the IC 204 may not be mounted to the substrate 206. In these embodiments, the circuit 200 may only include the IC 204 without the substrate 206.

Functionally, the IC 204 may include the integrated power supply 202 that supplies an output signal. The integrated power supply 202 may include a pulse width modulator ("PWM") 216 and a filter 212. The PWM 216 is configured to generate a PWM output signal. Specifically, through synchronized switching of a network of transistors, the PWM 216 may generate the PWM output signal. In some embodiments, the PWM output signal may be a rectangular pulse wave including a frequency and a current.

The network of transistors may be constructed using various types of semiconductor technologies. For example, the network of transistors may be constructed using CMOS, BiCMOS, EDMOS, OG EDMOS, or some combination thereof. Additionally, the network of transistors may be constructed of a specific subset of the semiconductor technologies. The specific subset of the semiconductor technologies may be determined to optimize a quality of the network of transistors. For example, the quality might include efficient switching, minimal capacitance, minimal resistance, or some combination thereof. For example, the network of transistors may include one or more switching MOSFETs constructed using OG EDMOS technology to minimize capacitance and to minimize resistance when the switching MOSFETs are operating.

The PWM output signal generated by the PWM 216 may be used in at least two ways. First, the PWM output signal generated by the PWM 216 may pass through the filter 212. By passing the PWM output signal through the filter 212, the PWM output signal may be converted to the output signal of the integrated power supply 202.

Additionally or alternatively, the PWM 216 may be a PWM controller that triggers an active switch 236. That is, the PWM 216 may generate the PWM output signal that may trigger the active switch 236. The active switch 236 may control the introduction of a source signal (not shown) to the circuit 200 through the filter 212 and/or may control the introduction of the source signal through components and/or portions of the filter 212.

For example, the PWM 216 may be electrically coupled to a base of a transistor, the source signal may be a constant 3.3 volt ("V") signal electrically coupled to a collector of the transistor, and an emitter of the transistor may be electrically coupled to the filter 212. The PWM output signal may supply the base of the transistor with a current to trigger the transistor, turning the transistor on. When the transistor is on, the constant 3.3 V signal may enter the filter 212. As used herein, "on" or "closed" indicates that a switch (or transistor) is allowing an electrical current to flow, while "off" or "open" indicates the switch (or transistor) is preventing an electrical current from flowing.

In another example, the output PWM signal may trigger the active switch 236 that may control the introduction of the source signal to an inductor. Energy of the source signal may be stored in the inductor while the active switch 236 is in a first state. The energy stored in the inductor may then be release in a controlled manner upon a change-in-state of the active switch 236. The energy stored in the inductor may then pass to another component of the filter 212, which may modify the source signal. Some example modifications to the source signal may include amplifying a voltage of the source signal, inverting the polarity of the source signal, or lowering the voltage of the source signal.

Examples of the active switch 236 may include, but are not limited to, a transistor switch such as a MOSFET. In embodiments in which the active switch 236 is a MOSFET, triggering the MOSFET with the PWM output signal may reduce power consumption of the integrated power supply 202 compared to embodiments utilizing other active switches 236. Additionally, by triggering the MOSFET with the PWM output signal, the output signal of the integrated power supply 202 may be provided to the circuit 200 and/or through components and/or portions of the filter 212 in a controlled manner. The source signal may be a signal received from a host power supply 226 such as a constant voltage, for instance.

The function of the filter 212 may be essentially identical regardless of the operation of the PWM 216. That is, the filter 212 modifies an input signal to supply a specific output signal. In embodiments in which the PWM 216 is the PWM controller, the input signal to the filter 212 may include the source signal. In contrast, in embodiments in which the PWM output signal is converted to the output signal, the input signal to the filter 212 may include the PWM output signal from the PWM 216.

Specifically, the filter 212 may receive the PWM output signal and/or the source signal and perform an operation on the PWM output signal and/or the source signal. The operation performed by the filter 212 on the PWM output signal and/or the source signal may include filtering, amplifying, modulating, attenuating, or some combination thereof. For example, the filter 212 may be a low-pass filter configured to attenuate the amplitude of the PWM output signal above a cut-off frequency, which may result in the output signal of the integrated power supply 202.

The filter 212 may include IC actives 234. The IC actives 234 may include, but are not limited to, transistors, active inductors such as gyrators, Schottky diodes, synchronous rectifiers, spiral inductors, or some combination thereof.

As depicted in FIG. 2, the filter 212 is located in the IC 204. However, as detailed below, this depiction is not intended to be limiting. The filter 212 may include IC passives 214, substrate integrated passives 218, PCB passives 232 or some combination thereof (collectively "filter passives 214/218/232"). The IC passives 214, the substrate integrated passives 218, and the PCB passives 232 may be located in the IC 204, in the substrate 206, and on a PCB 228, respectively. Some example filter passives 214/218/232 might include capacitors, inductors, resistors, and diodes.

The filter passives 214/218/232 are constructed in some configuration to perform the operation of the filter 212. The type, that is, capacitor, inductor, etc., and configuration of the filter passives 214/218/232 may be determined by the operation performed by the filter 212. Additionally, the filter passives 214/218/232 may have specific capacities. For example, in some embodiments, the filter passives 214/218/232 may include an inductor with a capacity of 10 nanohenry ("nH") inductance or a capacitor with the capacity of 10 nanofarad ("nF") capacitance. Generally, the capacity of the filter passives 214/218/232 may be related to the physical size of the filter passives 214/218/232.

A capacity of the filter passives 214/218/232 to perform the operation of the filter 212 may be configured based on the frequency of the PWM output signal. For example, if the PWM output signal has a frequency of about 0.5 megahertz ("MHz"), the filter passives 214/218/232 of the filter 212 may include an inductor with about 10 microhenry ("μH") of inductance to supply a specific output signal. In contrast, if the PWM output signal has a frequency of about 500 MHz, the filter passives 214/218/232 of the filter 212 may include an inductor with about 2 nH of inductance to supply the specific output signal. Thus, as the frequency of the PWM output signal increases, the capacity and/or the physical size of the filter passives 214/218/232 may decrease.

The capacity of the filter passives 214/218/232 to perform the operation of the filter 212 may also be configured based on the current of the PWM output signal and/or the source signal. For example, if the current of the source signal is about 1500 milliampere ("mA"), the filter 212 may include an inductor with about 10 μH of inductance to supply a specific output signal. In contrast, if the current of the source signal is about 15 mA, the filter 212 may include an inductor with about 10 nH of inductance to supply the specific output signal. Thus, as the current of the PWM output signal and/or the source signal increases, the capacity and/or the physical size of the filter passives 214/218/232 may increase.

In some embodiments, physical dimensions may limit integration of the filter passives 214/218/232 into the IC 204 and/or the substrate 206. Thus, the inclusion of the IC passives 214, the substrate integrated passives 218, the PCB passives 232, or some combination thereof in the filter 212 may be determined by the frequency the PWM output signal and/or current of the PWM output signal and/or the source signal.

For example, the frequency and the current of the PWM output signal may be about 500 MHz and about 80 mA, respectively. In this and other embodiments, the filter 212 may include IC passives 214 that may include an IC integrated spiral inductor, for example, formed in the IC 204.

In another example, the frequency and the current of the PWM output signal may be about 500 MHz and about 150 mA, respectively. In this and other embodiments, the filter 212 may include substrate integrated passives 218 that may include an LTCC integrated spiral inductor and/or a chip capacitor. Some advantages of the substrate integrated passives 218 may include thermal properties of the substrate integrated passives 218. That is, the substrate integrated passives 218 may generate less thermal energy than IC passives 214 and/or PCB passives 232, may more efficiently dissipate thermal energy than IC passives 214 and/or PCB passives 232, may divert thermal energy from the IC 204, or some combination thereof. The thermal properties of the substrate integrated passives 218 may be related to composition of the substrate 206.

In yet another embodiment, the frequency and the current of the PWM output signal may be about 1 MHz and about 1500 mA, respectively. In this and other embodiments, the filter 212 may include PCB passives 232 that may include a ferrite core inductor, for example.

The frequency and/or the current that determine the size of the filter passives 214/218/232 may vary based on the type of the filter passives 214/218/232. For example, to integrate an inductor into the IC 204, the frequency and the current of the PWM output signal may be above about 100 MHz and below about 100 mA, respectively. This, however, is not necessarily representative of corresponding values for capacitors and/or resistors, for instance.

The IC 204 may additionally include other integrated components 208. In some embodiments, the other integrated components 208 may receive the output signal of the integrated power supply 202 from the filter 212. That is, the other integrated components 208 may operate based on the output signal of the integrated power supply 202 generated by the PWM 216, the source signal, and the filter 212, for instance. Thus, the IC 204 may include both the integrated power supply 202 and the other integrated components 208. The other integrated components 208 may include, but is not limited to: a CDR, a transmitter ("Tx") driver, a receiver ("Rx") CDR, an Rx coupled to a transimpedance amplifier, a modular bias monitor, a bias tee, a linear operational amplifier ("opamp"), a modulator driver, a variable optic attenuator ("VOA") controller, a microcontroller (also referred to as a "μ-controller"), an electro-absorption ("EA") bias controller/monitor/bias tee, a digital-to-analog converter ("DAC"), an analog-to-digital converter ("A/D"), a semiconductor optical amplifier ("SOA") controller, electrically erasable programmable read-only memory ("EEPROM"), a thermal electric cooler ("TEC") controller, an H-bridge, a temperature sensor circuit, an inrush control, or some combination thereof. Several example embodiments are detailed below.

The substrate 206 may include one or more substrate transmission lines 220. Generally, the substrate transmission lines 220 may provide electrical and/or communicative couplings between components located in the IC 204 and components located in the substrate 204, located on the PCB 228, the appliances 224, or some combination thereof. For example, the substrate transmission lines 220 may enable communication between the IC 204 and the substrate 206. In some embodiments in which the filter 212 includes the IC passives 214 and the substrate integrated passives 218, the substrate transmission lines 220 may allow the source signal to be communicated from the IC 204 to the substrate 206 and then back to the IC 204. More specifically, the source signal may enter the circuit 200 through the active switch 236 triggered by the PWM 216. The source signal may pass through the active switch 236 and may then enter the IC passives 214. A first intermediate signal, which may be representative of the source signal, exiting the IC passives 214, may then be communicated via the substrate transmission lines 220 to the substrate integrated passives 218. A second intermediate signal, which may be representative of the first intermediate signal, exiting the substrate integrated passives 218, may then be communicated via the substrate transmission lines 220 to the other integrated components 208.

Additionally or alternatively, the substrate transmission lines 220 may enable the communication of a signal between the IC 204 and the PCB 228. Specifically, in some embodiments in which the filter 212 includes the PCB passives 232 and the IC passives 214, the source signal may enter the circuit 200 via an active switch 236 triggered by the PWM 216. The source signal may then enter the IC passives 214. A first intermediate signal, which may be representative of the source signal, exiting the IC passives 214, may then be communicated across the substrate 206 and to the PCB passives 232 via the substrate transmission lines 220. A second intermediate signal, which may be representative of the first intermediate signal, exiting the PCB passives 232, may then be communicated via the substrate transmission line 220 to the other integrated components 208.

The two examples above are not limiting. For example the substrate transmission lines 220 may communicatively couple one or more of the integrated power supply 202, the PWM 216, the filter 212, the IC passives 214, the active switch 236, the other integrated components 208 with the substrate integrated passives 218, the substrate 206, the PCB 228, the other PCB components 230, the PCB passives 232, the appliances 224, or some combination thereof.

In some embodiments, the IC 204 may include one or more other integrated power supplies 210. The other integrated power supplies 210 may include a PWM similar to PWM 216 and a filter similar to filter 212. The other integrated power supplies 210 may supply a second output signal that may be used to operate one or more of the other integrated components 208. Additionally or alternatively, the integrated power supply 202 and the other integrated power supplies 210 may combine to supply one output signal to one or more other integrated components 208. Additionally or alternatively, the other integrated power supplies 210 may supply the second output signal for one or more of the other PCB components 230 and/or the appliances 224.

The circuit 200 is depicted mounted to the PCB 228. Generally, the PCB 228 may include any structure, rigid or flexible, including non-conductive substrates with conductive layers therebetween and conductive pathways etched in and/or printed on the non-conductive substrates. Additionally, the other PCB components 230 may be mounted to the PCB 228. The other PCB components 230 may include any optical and/or electrical component.

For example, the other PCB components 230 may be PCB passives 232, drivers, electrical circuits, microprocessors, power supplies, amplifiers, etc. The circuit 200 and/or the other PCB components 230 may independently and/or cooperatively communicate with the appliances 224 via a transmission line 222.

The circuit 200 and the other PCB components 230 occupy surface area on the PCB 228. Accordingly, the PCB 228 may be constructed to provide an adequate surface area to accommodate the circuit 200 and the other PCB components 230. Because the circuit 200 may include the substrate 206, the IC 204, and the components included therein, the circuit 200 may occupy relatively less surface area on the PCB 228 than a comparable configuration in which each of the components in the IC 204 are separately mounted directly to the PCB 228. Thus, the IC 204 including the integrated power supply 202, the other integrated power supplies 210, and the other integrated components 208 may enable a reduction in size of the PCB 228 and/or the inclusion of more other PCB components 230.

Alternatively, in some embodiments, the circuit 200 may not be mounted to the PCB 228. Instead, the substrate 206 of the circuit 200 may be mounted or connected adjacent to the appliance 224. In these and other embodiments, the substrate transmission line 220 and/or the transmission line 222 may allow communicative coupling between the circuit 200 and the appliance 224.

The PCB 228 and/or the circuit 200 may be incorporated in an optoelectronic device such as a transceiver module. For example, with combined reference to FIGS. 1A-2, the PCB 228 and/or the circuit 200 may be included in one or more components of the transceiver 100 depicted in FIGS. 1A and 1B. For example, the PCB 228 and/or the circuit 200 may be included in the ROSA 122 and/or the TOSA 120. Additionally or alternatively, the PCB 228 with the circuit 200 mounted thereon correspond to the PCB 124.

As discussed above, generally, the higher the frequency of the PWM output signal; the lower the capacity and/or the physical size of the filter passives 214/218/232. The relationship between the frequency of the PWM output signal and the filter passives 214/218/232 may also apply to IC actives 234 and/or the active switch 236. For example, the higher the PWM signal frequency, the lower a capacitance and an RDS-On of a MOSFET switch used as the IC active 234 or the active switch 236. Thus, an integrated power supply such as integrated power supply 202, may include "super-high" frequency PWM. As used herein, the term super-high frequency may include frequencies generally above about 500 MHz.

Figure 3:
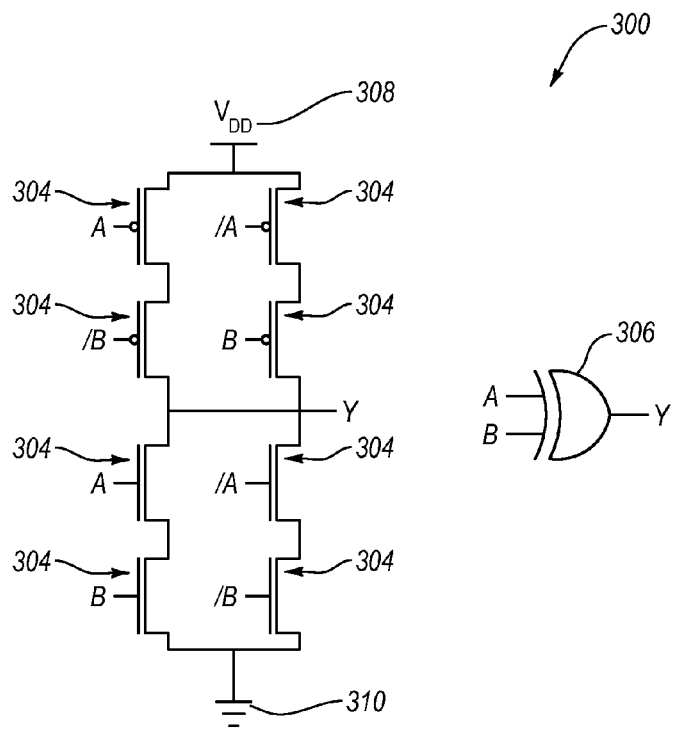
FIG. 3 illustrates an example PWM that may be implemented in the integrated power supply of FIG. 2.
Figure 4:
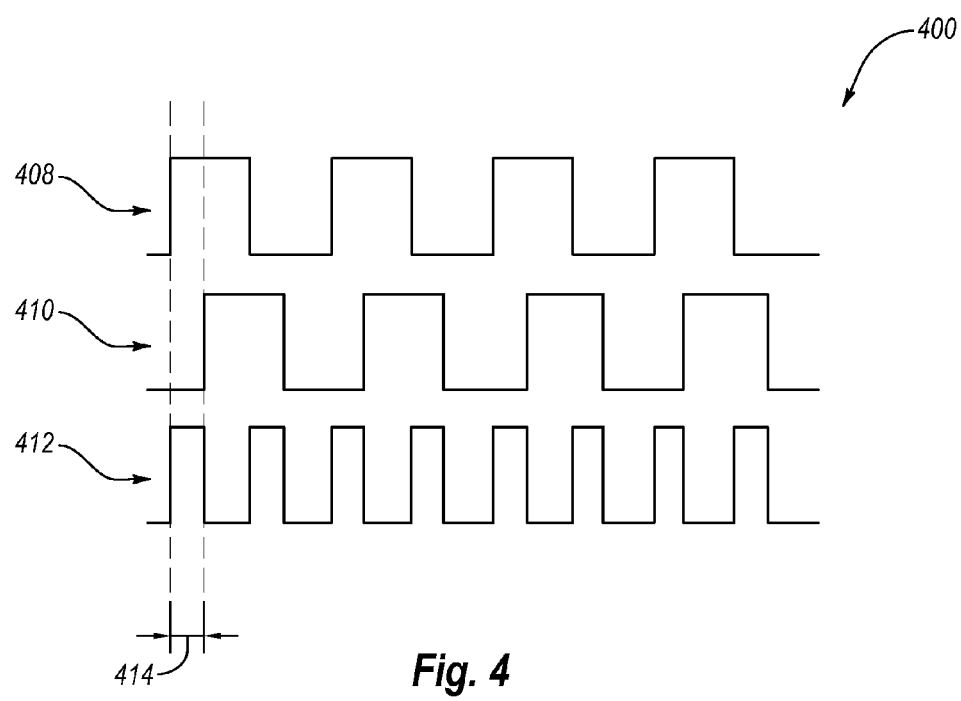
FIG. 4 illustrates an example signal set corresponding to the PWM of FIG. 3.

FIGS. 3 and 4 illustrate, an example super-high frequency PWM 300 and an example signal set 400 corresponding to the PWM 300, respectively. The PWM 300 may be included in the integrated power supply 202 of FIG. 2, and may correspond to the PWM 216, for example.

The PWM 300 includes multiple transistors 304 arranged between a voltage source 308 and a ground 310. The PWM 300 also includes an "XOR" gate 306 configured to receive one or more signals generated by cycling one or more sets of the transistors 304. The signal set 400 includes two clock signals 408 and 410 and a PWM output signal 412. The transistors 304 are designated as "A," "/A," "B," and "/B" which may correspond to a clock signal 408 or 410 of FIG. 4. For instance cycling the transistors 304 designated "A" and "/A" generates a first clock signal 408. Likewise, cycling the transistors 304 designated "B" and "/B" may generate a second clock signal 410. Accordingly, the transistors 304 may be configured to generate clock signals 408 and 410 having two phases. Between the frequency of first clock signal 408 and the frequency of the second clock signal 410 is a delay 414.

The clock signals 408 and 410 may be supplied to the XOR gate 306. The XOR gate 306 provides a "high" when either the first clock signal 408 or the second clock signal 410 is "high" and a "low" when the first clock signal 408 and the second clock signal are "high" and when the first clock signal 408 and the second clock signal are "low." The output of the XOR gate 306 is the PWM output signal 412. The PWM output signal 412 generated by the PWM 300 includes a frequency related to the clock signal and a duty cycle of the transistors 304 and which is greater than either the frequency of the first clock signal 408 or the frequency of the second clock signal 410. For example, the PWM signal 412 may include a frequency which is twice the frequency of the first clock signal 408 and/or the second clock signal 410. Additionally, because the relationship between the frequencies of the first clock signal 408 and the second clock signal 410 and the output of the XOR gate 306, a duty cycle of the PWM signal 412 may be adjusted by varying the delay 414 between the two clock signals 408 and 410.

To achieve super-high frequency PWM output signals 410, the PWM 300 may utilize low-parasitic CMOS technology in the transistors 304 and/or the XOR gate 306. Additionally use of the CMOS technology may enable integration of the transistors 304 and/or the XOR gate 306 into a single monolithic chip.

FIGS. 5A-5E illustrate electrical diagrams of example integrated power supplies 500A-500E. The integrated power supplies 500A-500E of FIGS. 5A-5E may include specific embodiments of the integrated power supply 202 of FIG. 2. In FIGS. 5A-5E, the example integrated power supplies 500A-500E may include an IC that is depicted as a box with a solid border. The integrated power supplies 500A-500E may also include: one or more MOSFETs; one or more source power supplies that supply a source signal; a power ground; an external filter; one or more inductors; one or more capacitors; one or more resistors; one or more diodes; or some combination thereof. The integrated power supplies include a PWM controller, which is depicted by a box with a dashed border. The PWM controller may further include an instrument amplifier, a proportional-integral ("PI") control, a temperature set DAC, a PWM, a compensator, a trans-conductance amplifier, and a reference voltage. Additionally, the example integrated power supplies depicted in FIGS. 5A-5E include a representation illustrating an output voltage.

The PWM, the MOSFETs, the diodes, and the integrated circuits may be constructed using various semiconductor technologies, such as CMOS, BiCMOS, EDMOS, OG EDMOS technologies, or some combination thereof. The diodes may be schottky diodes and/or may be MOSFETs with synchronous rectification. The PWM may generate a PWM output signal with a frequency greater than 500 MHz. The inductors, the capacitors, the resistors, and the diodes may be included in the IC or in a substrate (not shown).

The example integrated power supplies depicted in FIGS. 5A-5E function by the PWM triggering one or more MOSFETs. When the one or more MOSFETs are on, the source signal may be introduced to the example integrated power supplies.

Figure 5A:
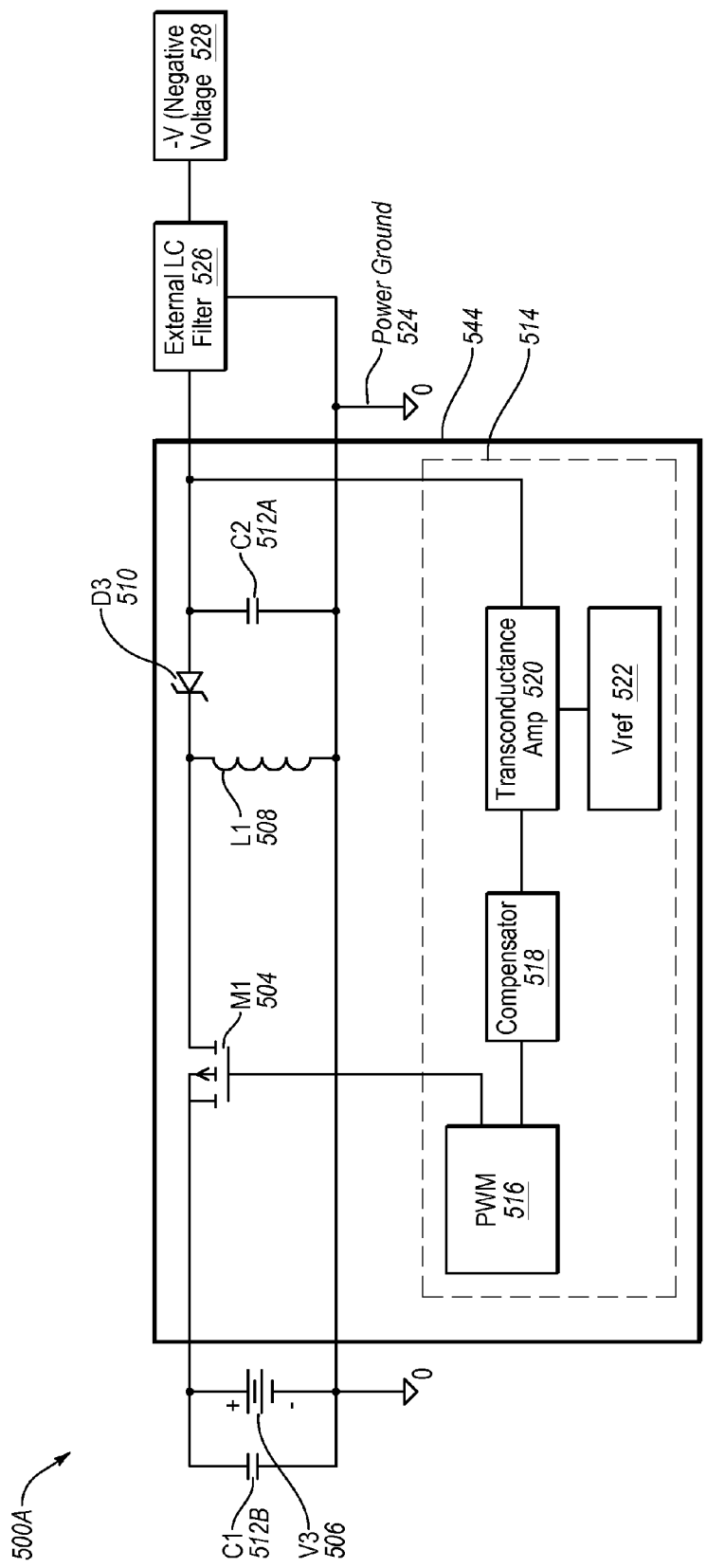
FIGS. 5A-5E illustrate electrical diagrams of example integrated power supplies that may be implemented in the circuit of FIG. 2.

FIG. 5A illustrates an example integrated negative output power supply 500A. The integrated negative output power supply 500A includes: a MOSFET 504; an external source power supply 506 that supplies a source signal; an inductor 508; a diode 510; capacitors 512A and 512B; a PWM controller 514 which further includes a PWM 516, a compensator 518, a trans-conductance amplifier 520, and a reference voltage Vref 522. The integrated negative output power supply 500A may further include a power ground 524; an external LC filter 526, and an output voltage 528. As depicted, the PWM controller 514, the MOSFET 504, the inductor 508, the diode 510, and the capacitor 512A may be integrated into an IC that may correspond to the IC 204 of FIG. 2.

Figure 5B:
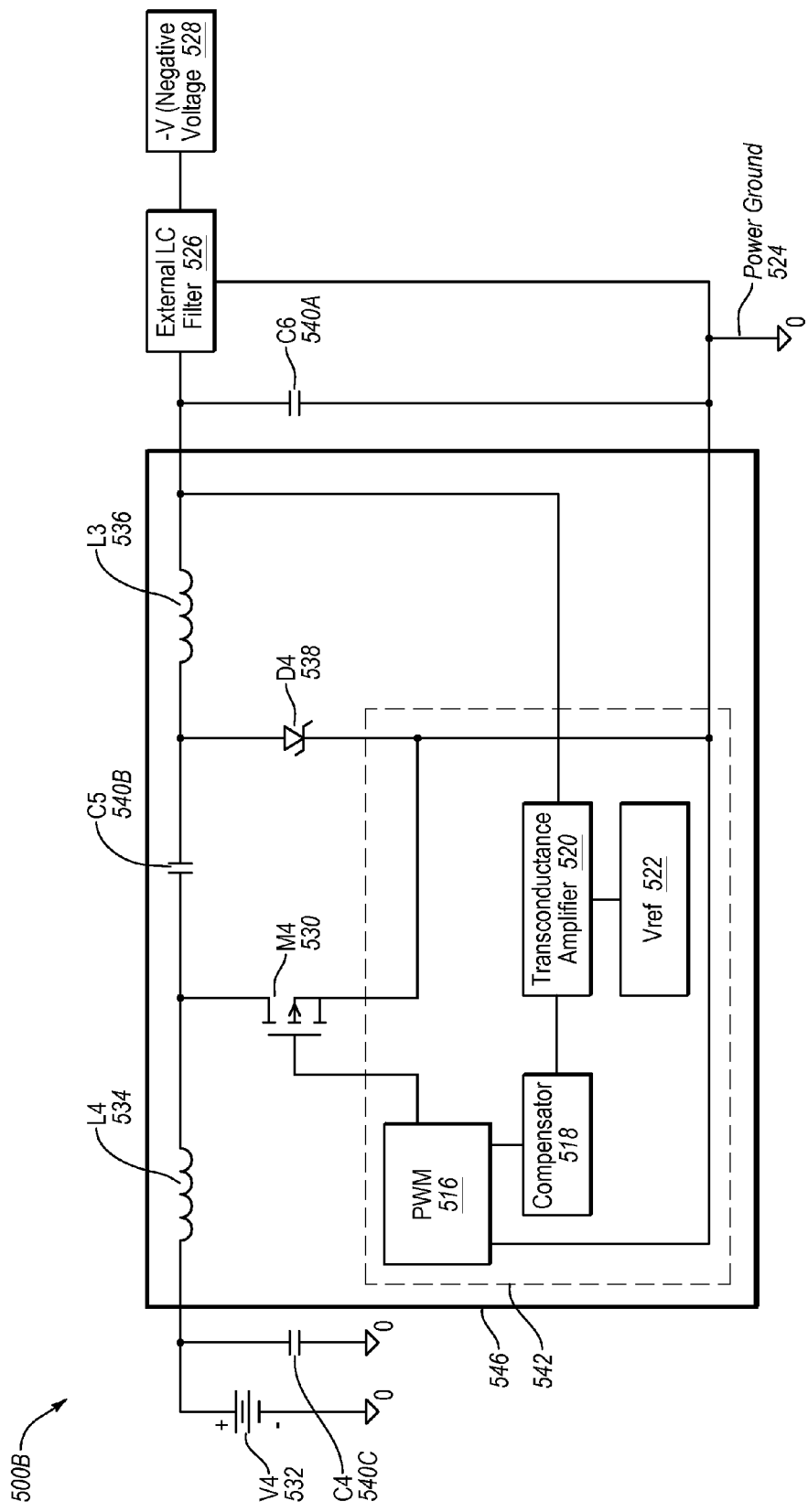

FIG. 5B illustrates an example Cuk inverter 500B. The Cuk inverter 500B includes a MOSFET 530; an external source power supply 532 that supplies a source signal; inductors 534 and 536; a diode 538; capacitors 540A, 540B, and 540C; and a PWM controller 542. The PWM controller 542 may further include a PWM 516, a compensator 518, a trans-conductance amplifier 520, and a reference voltage 522. The Cuk inverter 500B may also include an external LC filter 526; a power ground 524; and an output voltage 528. As depicted, the PWM controller 542, the MOSFET 530, the inductors 532 and 534, the diode 538, and the capacitor 540B may be integrated into an IC 546 that may correspond to the IC 204 of FIG. 2.

Figure 5C:
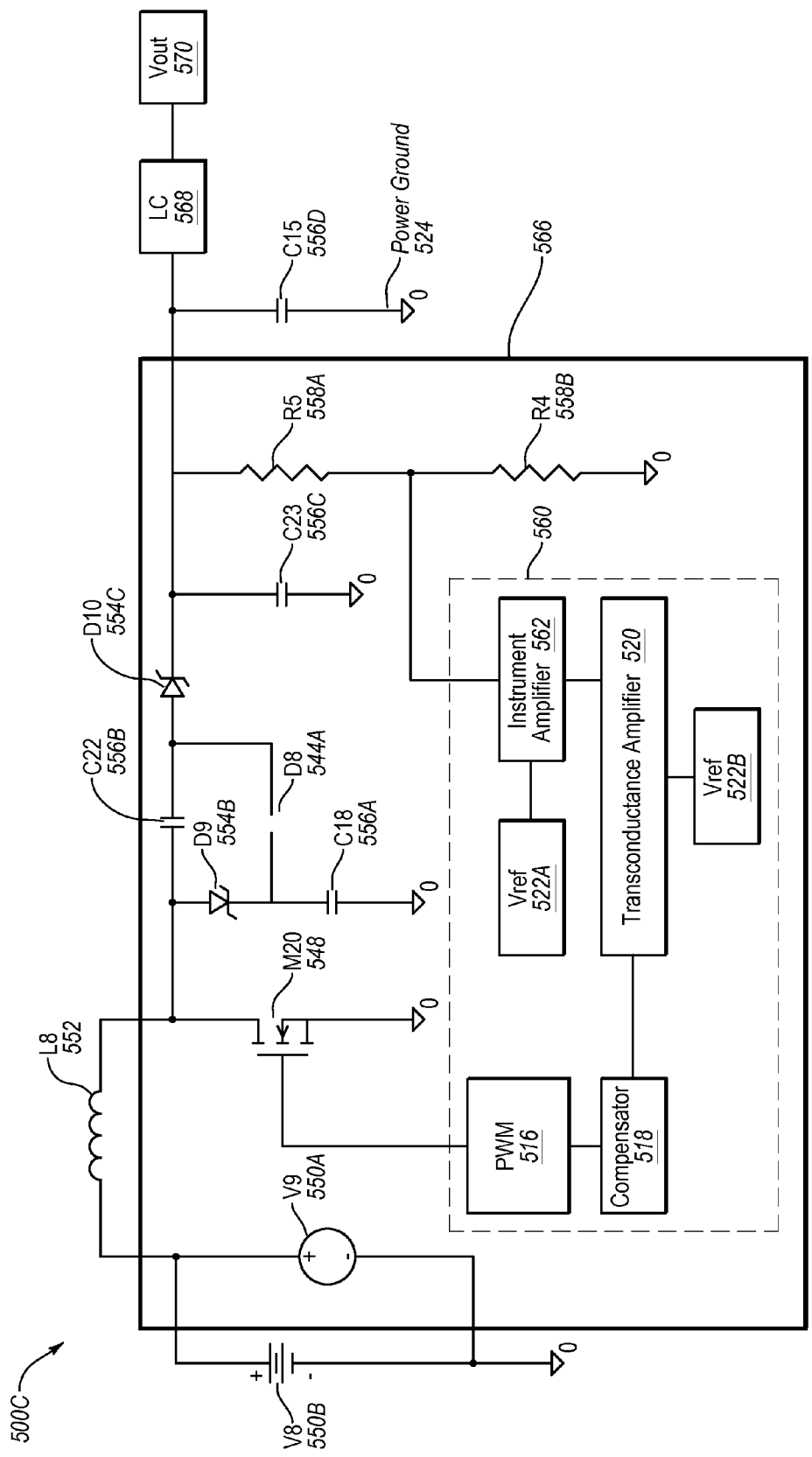

FIG. 5C illustrates an example avalanche photo diode ("APD") controller 500C. The APD controller 500C may include a MOSFET 548; source power supplies 550A and 550B that supply a source signal; an inductor 552; diodes 554A, 554B, and 554C; capacitors 556A, 556B, 556C, and 556D; resistors 558A and 558B, and a PWM controller 560. The PWM controller 560 may further include a PWM 516, a compensator 518, a trans-conductance amplifier 520, reference voltages 522A and 522B, and an instrument amplifier 562. The APD controller 500C may also include a power ground 524; an LC filter 568; and an output voltage 570. As depicted, the PWM controller 560, the MOSFET 548, diodes 554A-554C, capacitors 556A-556C, resistors 558A and 558B, and the source power supply 550A may be integrated into an IC 566 that may correspond to the IC 204 of FIG. 2.

Figure 5D:
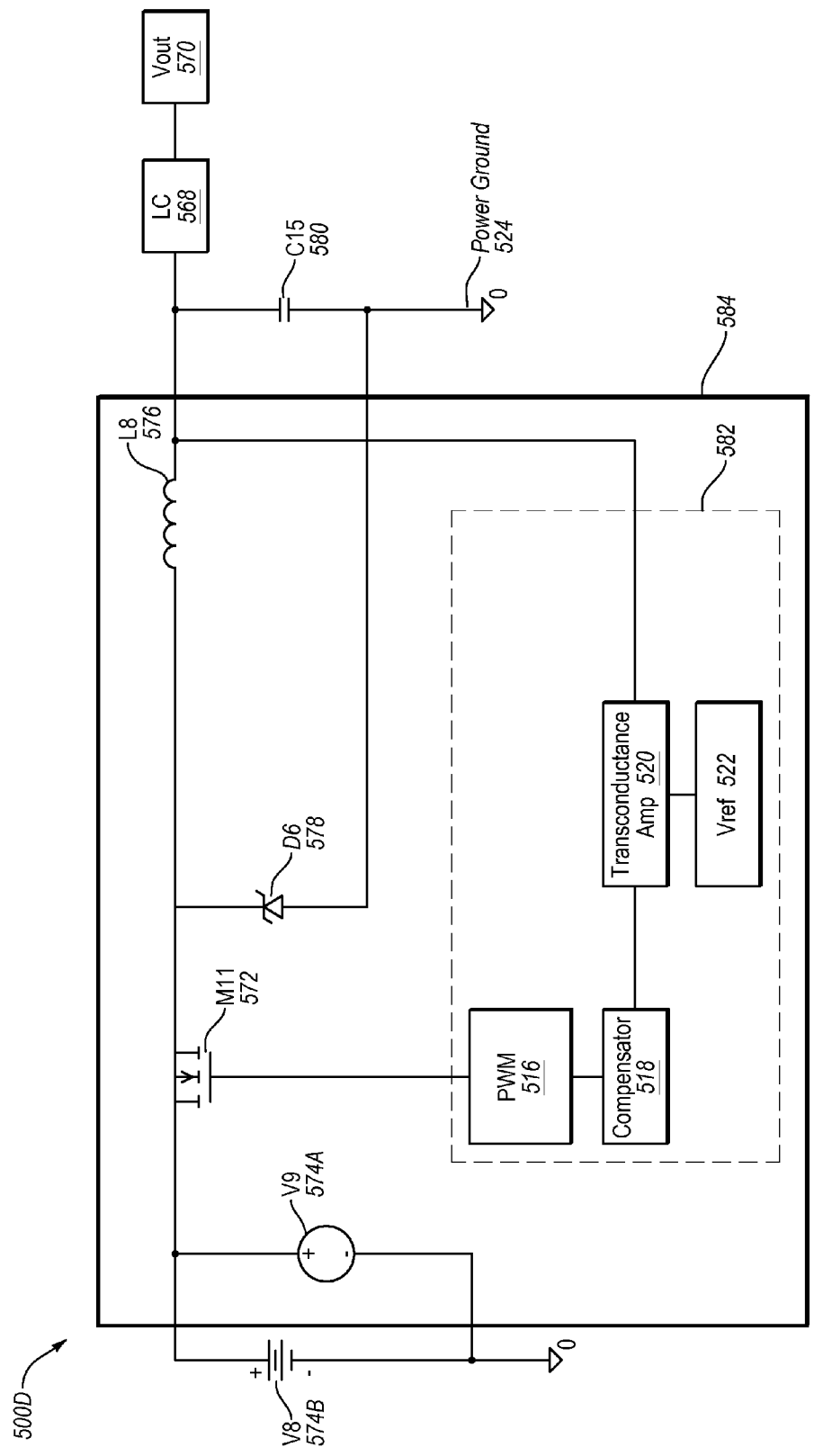

FIG. 5D illustrates an example step down switcher 500D. The step down switcher 500D may include a MOSFET 572; source power supplies 574A and 574B that supply a source signal; an inductor 576; a diode 578; a capacitor 580; and a PWM controller 582. The PWM controller 582 may further includes a PWM 516, a compensator 518, a trans-conductance amplifier 520, and a reference voltage 522. The step down switcher 500D may also include a power ground 524, an LC filter 568, and an output voltage 570. As depicted, the PWM controller 582, the MOSFET 572, the inductor 576, the diode 578, and the source power supply 574A may be integrated into an IC 584 that may correspond to the IC 204 of FIG. 2.

Figure 5E:
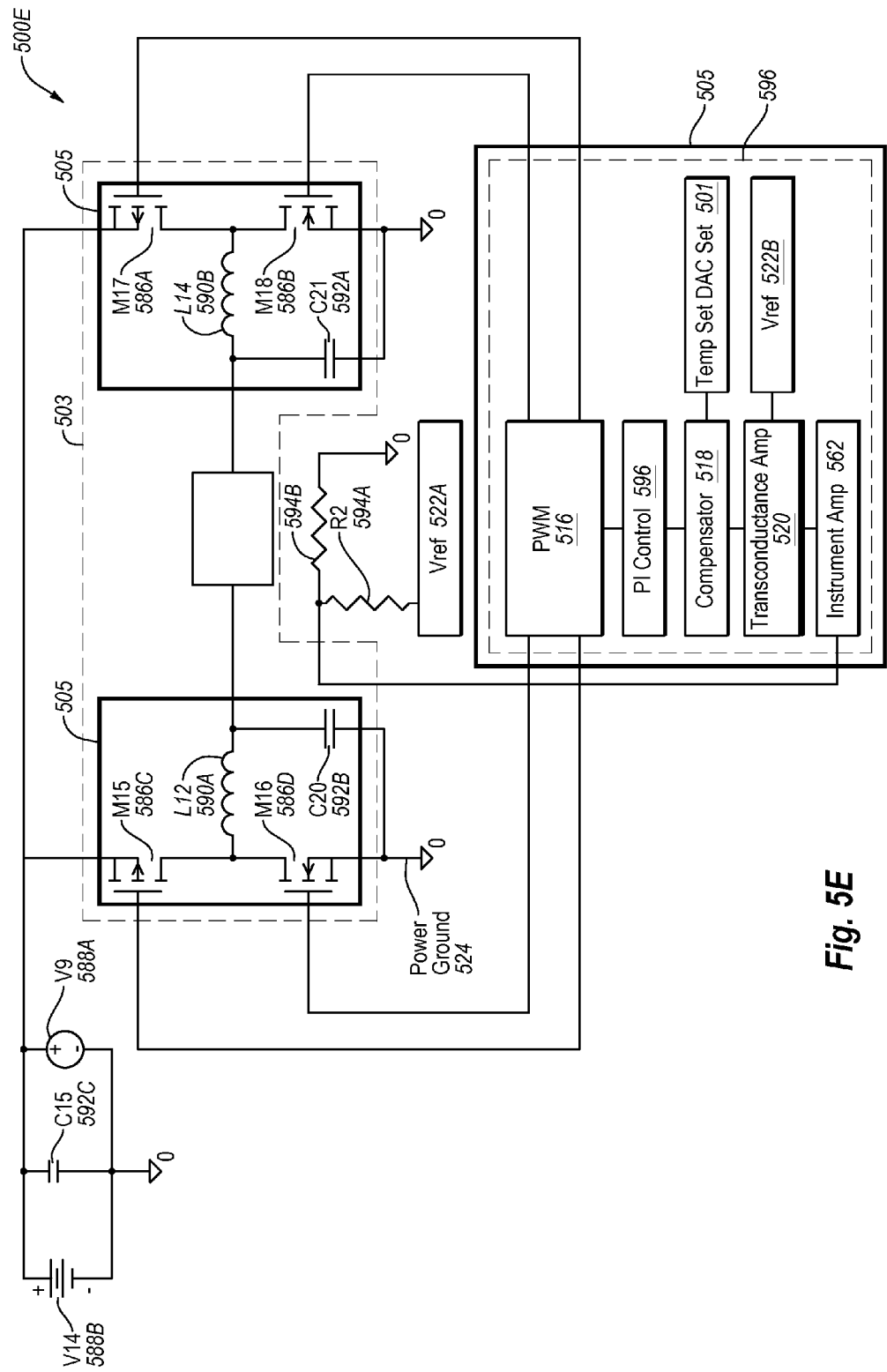

FIG. 5E illustrates an example H-Bridge TEC control 500E. The H-Bridge TEC control 500E may include MOSFETs 586A-586D; source power supplies 588A and 588B that supply a source signal; inductors 590A and 590B; capacitors 592A-592C; resistors 594A and 594B, which is connected to one of the reference voltages 522A; and a PWM controller 596. The PWM controller 596 may further include a PWM 516, PI control 598, a compensator 518, a trans-conductance amplifier 520, an instrument amplifier 562, a temperature set DAC 501, another reference voltage 522B, a power ground 524, and a high resistance type Peltier cell TEC 503. As depicted, the PWM controller 596, the MOSFETs 586A-586D, the capacitors 592A and 592B, and the inductors 590A and 590B may be integrated into an IC 505.

FIGS. 6A-6D illustrate block diagrams of example circuits 600A-600D that include some specific embodiments of the circuit 200 of FIG. 2. As depicted in FIGS. 6A-6D, the example circuits 600A-600D include an IC 602 and a substrate 604. The IC 602 may include one or more integrated power supplies such as those discussed in FIGS. 5A-5E as well as other types of integrated power supplies. The circuits 600A-600D additionally include passives. The passives may include capacitors 606, which are illustrated as small squares, substrate integrated spiral inductors 608, which are illustrated as ovals, and/or IC integrated spiral inductors 610, which are illustrated as black circles. The substrates 604 may also include substrate transmission lines 612, which are illustrated as black rectangles. The circuits 600A-600D may additionally include other integrated technologies. The ICs 602 depicted in FIGS. 6A-6D, may be constructed using CMOS, EDMOS, OG EDMOS, SiGe HBT-CMOS technologies, or some combination thereof.

Although not apparent from the Figures, substrate integrated spiral inductors 608 may be included in the substrates 604. This is not apparent in FIGS. 6A-6D because FIGS. 6A-6D, are two-dimensional which results in a loss of depth.

The ICs 602 are mounted to the substrates 604 and the substrate integrated spiral inductors 608 are in the substrate 604.

Figure 6A:
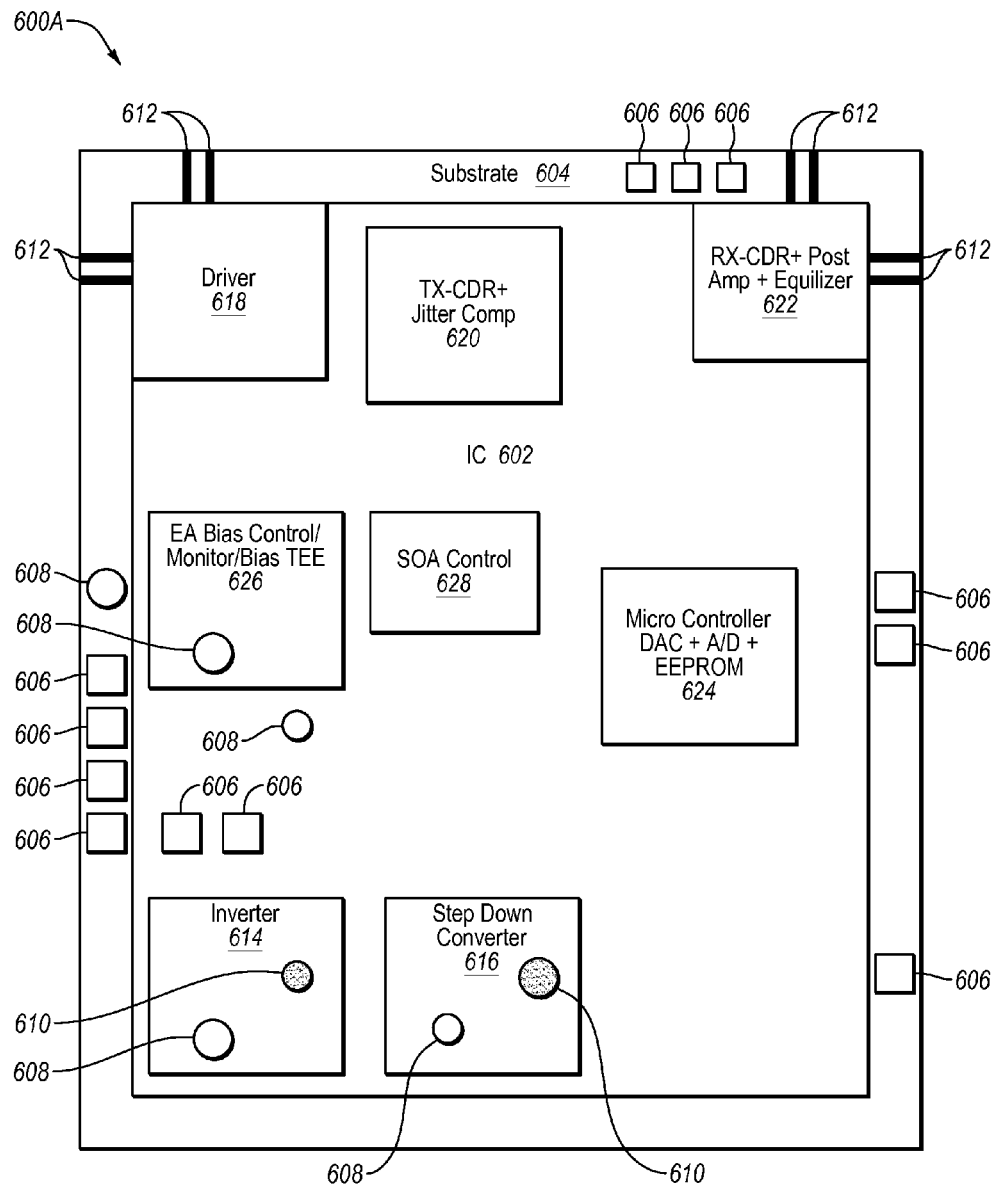
FIGS. 6A-6D illustrate block diagrams of example circuits that include some specific embodiments of the circuit of FIG. 2.

FIG. 6A illustrates an example circuit 600A including an IC 602 and a substrate 604. The IC 602 includes two integrated power supplies including an inverter 614 and a step down converter 616. Additionally, integrated into the IC 602 are a driver 618; a Tx, CDR and jitter compensator 620; a Rx CDR, power amplifier, and equalizer 622; a microcontroller, DAC, A/D, and EEPROM 624; an EA bias controller/monitor/bias tee 626; and a SOA controller 628. The IC 602 may include two IC integrated spiral inductors 610 and two integrated capacitors 606. The substrate 604 may include five substrate integrated spiral inductors 608, ten capacitors 606, and eight substrate transmission lines 612.

Figure 6B:
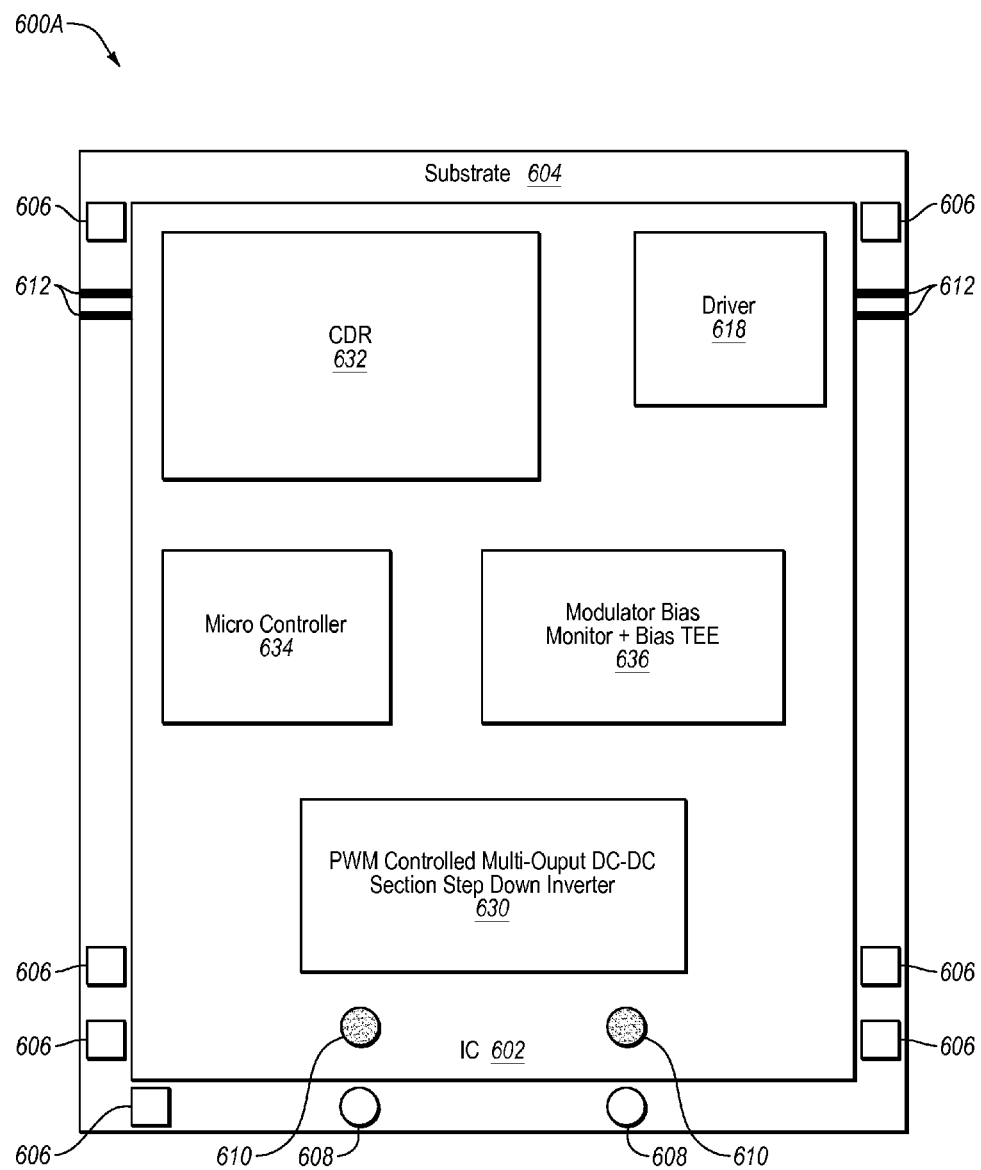

FIG. 6B illustrates another example circuit 600B including an IC 602 and a substrate 604. The IC 602 includes an integrated power supply including a multi-output DC-DC section and a step down inverter 630. Additionally, integrated into the IC 602 are a driver 618; a CDR 632; a microcontroller 634, and a modulator bias monitor and bias tee 636. The IC 602 may include two IC integrated spiral inductors 610. The substrate 604 may include two substrate integrated spiral inductors 608, seven capacitors 606, and four substrate transmission lines 612.

Figure 6C:
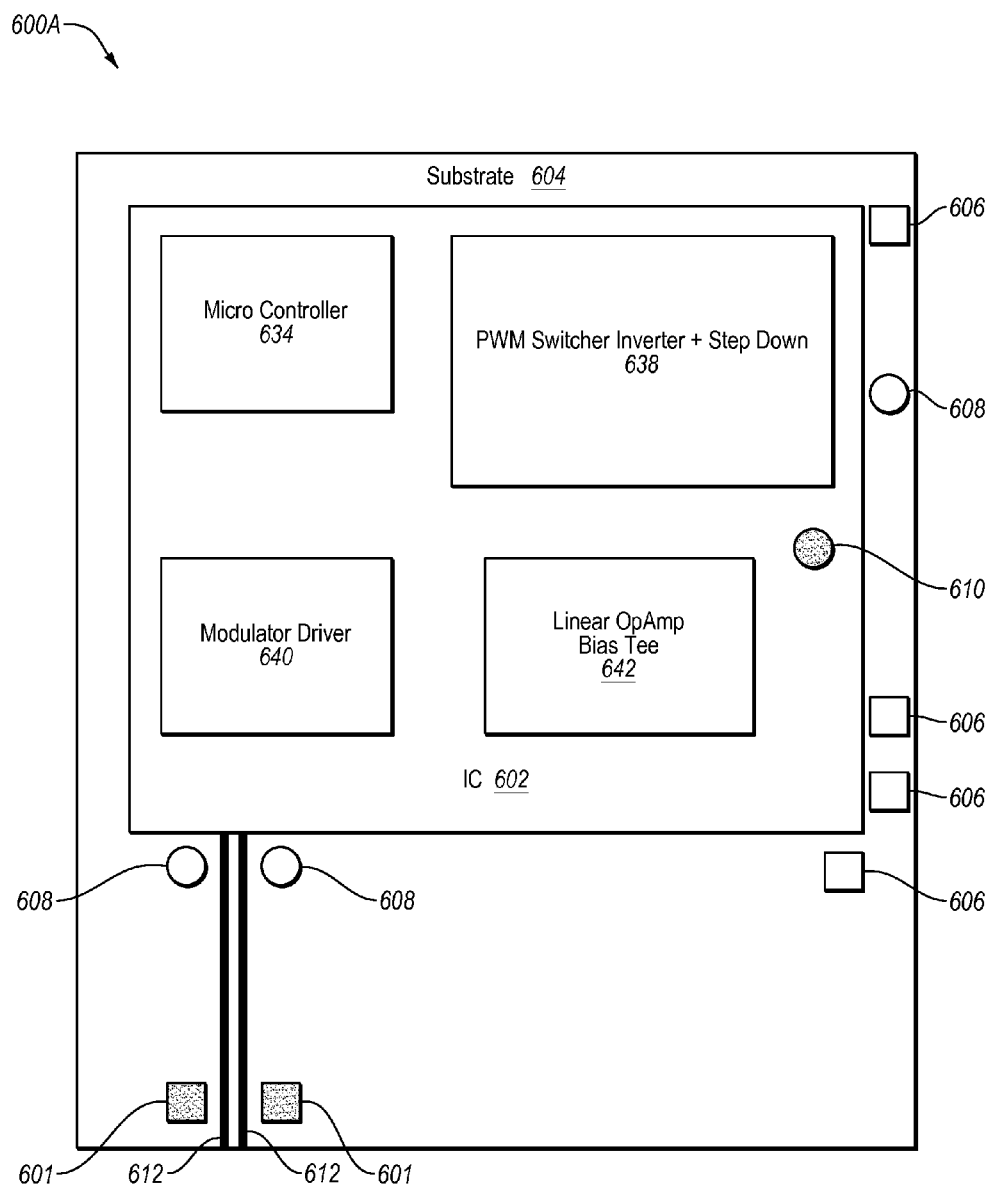

FIG. 6C illustrates another example circuit 600C including an IC 602 and a substrate 604. The IC 602 includes an integrated power supply including a PWM switcher inverter and step down converter 638. Additionally, integrated into the IC 602 are a modulator driver 640; a linear opamp and bias tee 642; and a microcontroller 634. The IC 602 may include an IC integrated spiral inductor 610. The substrate 604 may include five substrate integrated spiral inductors 608, four capacitors 606, and four substrate transmission lines 612. Additionally, the circuit 600C may include two bias tee integrated inductors 601, which may be ferrite and/or integrated into the substrate 604.

Figure 6D:
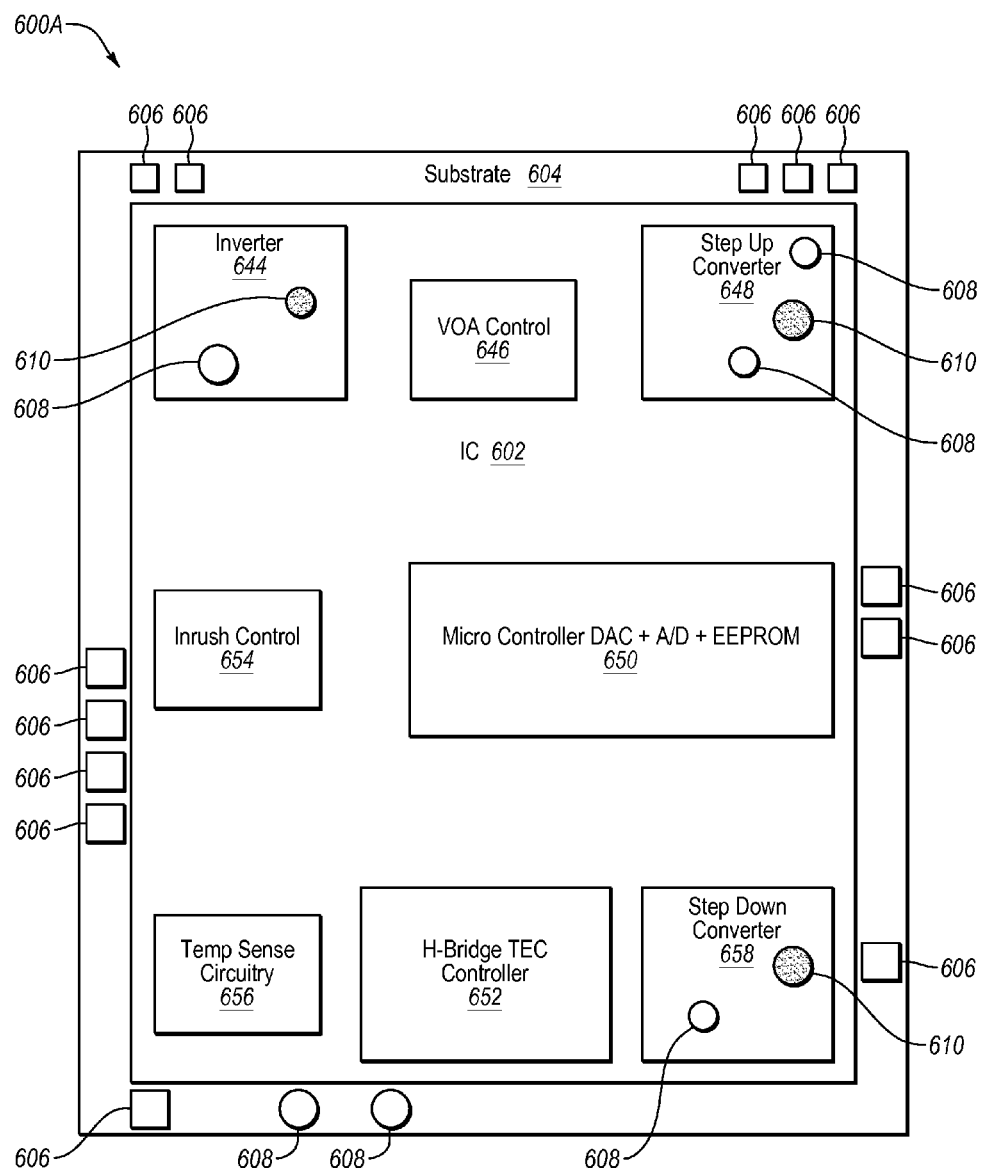

FIG. 6D illustrates another example circuit 600D including an IC 602 and a substrate 604. The IC 602 includes four integrated power supplies. The integrated power supplies include an inverter 644, a step-up converter 648, a step-down converter 658, and an H-Bridge TEC controller 652. Additionally, integrated into the IC 602 are a microcontroller, DAC, A/D, and EEPROM 650; a VOA controller 646; an inrush controller 654; and temperature sense circuitry 656. The IC 602 may include three IC integrated spiral inductors 610. The substrate 604 may include six substrate integrated spiral inductors 608 and thirteen capacitors 606.

Figure 7:
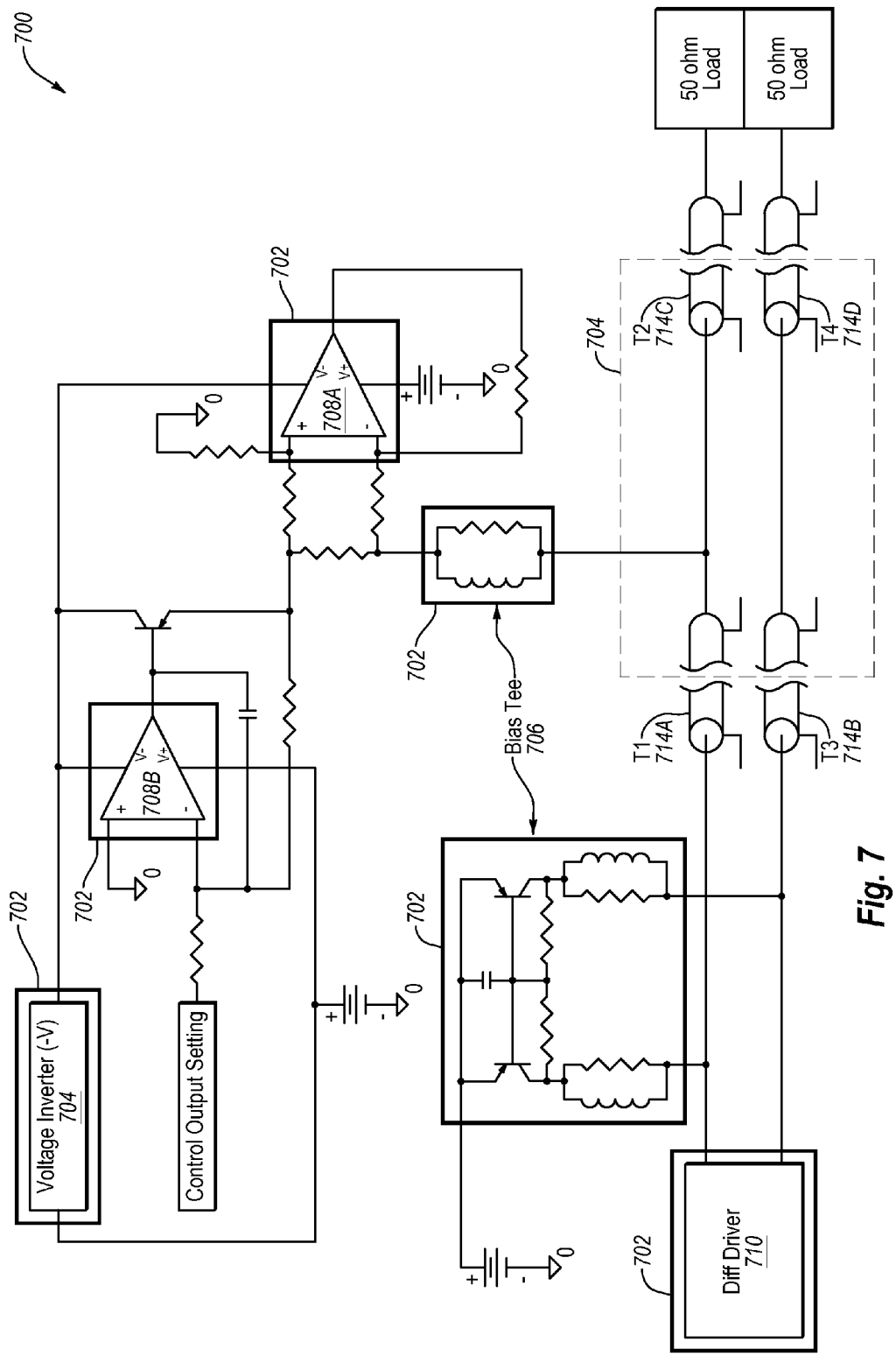
FIG. 7 illustrates a circuit diagram of an example circuit that may include a specific embodiment of the circuit of FIG. 2.

FIG. 7 illustrates a circuit diagram of an example circuit 700 that may include a specific embodiment of the circuit 200 of FIG. 2. As depicted in FIG. 7, the example circuit 700 may include one or more ICs 702 that may correspond to the IC 204 of FIG. 2. The components that may be included in the one or more ICs 702 are indicated by a box with a solid border. The example circuit 700 may also include a substrate. The components that may be included in the substrate 704 are indicated by a box with a dashed border. The IC 702 may include the voltage inverter 704 as an integrated power supply. Additionally, the IC 702 may include the high impedance broad-band bias tee 706 integrated into the IC 702, which is labeled "bias tee." The bias tee 706 may include spiral planar and/or stacked inductors and poly-silicon resistors. The IC 702 may include opamps 708A and 708B and a differential driver 710. The substrate 704 includes substrate transmission lines 712 that run from a first connector 714A to a third connector 714C and from a second connector 714B to a fourth connector 714D. The IC 702 depicted in FIG. 7 may be constructed using CMOS, EDMOS, OG EDMOS, SiGe HBT-CMOS technologies, or some combination thereof.

Figure 8:
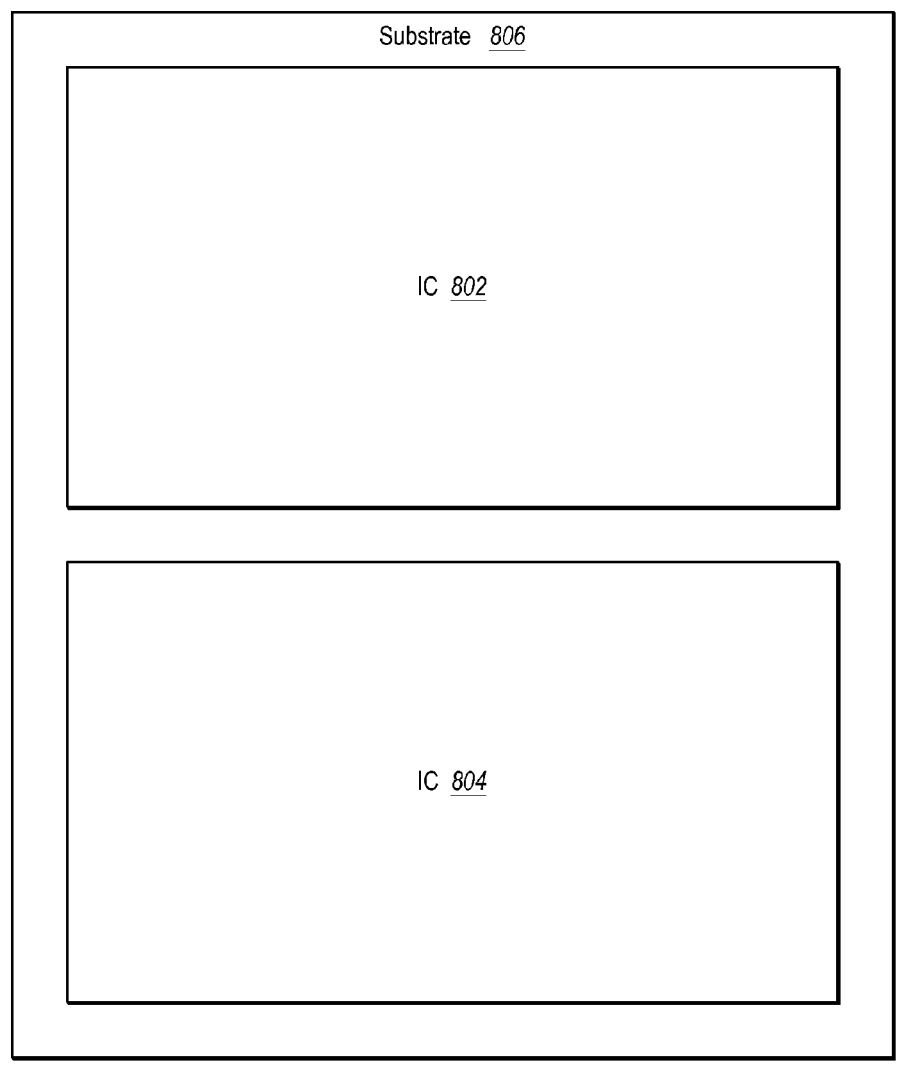
FIG. 8 illustrates a block diagram of an example multi-chip module ("MCM") circuit that may include the circuit of FIG. 2.

FIG. 8 illustrates a block diagram of an example multi-chip module ("MCM") circuit 800. The example MCM circuit 800 may include one or more specific embodiments of the circuit 200 of FIG. 2. As depicted in FIG. 8, the example MCM circuit 800 may include two or more ICs 802 and 804 and a substrate 806. The ICs 802 and 804 may include any of the circuits 600A-600D depicted in FIGS. 6A-6D or some variation thereof.

The present invention may be embodied in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optical assembly configured for use in fiber optic communication devices, the optical assembly comprising:
   an integrated circuit (IC) mounted to a substrate, the IC being constructed using an orthogonal gate extended drain complementary metal-oxide-semiconductor (OG EDCMOS) technology, the IC including:
      an inverter that includes an integrated power supply, the integrated power supply including:
         a filter configured to convert a source signal to an output signal of the integrated power supply, the filter including an IC passive component located in the IC and a substrate integrated passive component located in the substrate;
         an active switch configured to control an entry of the source signal to the filter; and
         a pulse width modulator ("PWM") configured to generate a PWM output signal that triggers the active switch,
         wherein a first capacity of the IC passive component and a second capacity of the substrate integrated passive component are configured based on a frequency of the PWM output signal and a current of the source signal; and
      other integrated components configured to receive the output signal from the filter and operate based on the output signal, the other integrated components including an integrated high-voltage driver, a modulator bias source, an active bias tee, a negative power supply, a clock and data recovery circuit, a post amplifier, an analog-to-digital converter, a microcontroller, and a digital-to-analog converter that are integrated into the same IC using the OG EDCMOS technology.

2. The optical assembly of claim 1, wherein the source signal includes a constant voltage source signal received from a host power supply.

3. The optical assembly of claim 1, wherein the filter includes a passive electrical component configured to modify the source signal and to convert the source signal to the output signal.

4. The optical assembly of claim 1, wherein the other integrated components further include a transmitter driver, a receiver CDR, a receiver coupled to a transimpedance amplifier, a linear operational amplifier, a modulator driver, a variable optic attenuator controller, an electro-absorption bias controller, an electro-absorption bias monitor, an electro-absorption bias tee, a semiconductor optical amplifier controller, electrically erasable programmable read-only memory, a thermal electric cooler controller, an H-bridge, a temperature sensor circuit, or an inrush control.

5. The optical assembly of claim 1, wherein the PWM operates at a frequency greater than about 50 megahertz ("MHz").

6. The optical assembly of claim 1, wherein the PWM is constructed using low-parasitic complementary metal-oxide-semiconductor (CMOS) technology.

7. The optical assembly of claim 1, wherein the PWM output signal includes a high frequency PWM output signal configured to reduce physical sizes of components of the filter and a physical size of the switch, and the high frequency PWM output signal includes a frequency above about 50 megahertz ("MHz").

8. The optical assembly of claim 1, wherein the IC includes a mixed-signal IC that includes the integrated power supply, one or more analog circuits, and one or more digital circuits integrated on a chip for fiber optics applications.

9. The optical assembly of claim 1, further comprising the substrate that includes a substrate transmission line, wherein:
the source signal enters the IC through the active switch triggered by the PWM, passes through the active switch, and enters the IC passive component;
a first intermediate signal that is representative of the source signal exits the IC passive component and is communicated across the substrate via the substrate transmission line to the PCB passive component; and
a second intermediate signal that is representative of the first intermediate signal exits the PCB passive component and is communicated via the substrate transmission line to the other integrated components.

10. An optical assembly comprising:
a substrate; and
an integrated circuit ("IC") mounted to the substrate, the IC being constructed using an orthogonal gate extended drain complementary metal-oxide-semiconductor (OG EDCMOS) technology, the IC including:
an inverter that includes an integrated power supply, the integrated power supply including:
a pulse width modulator (PWM) configured to generate a PWM output signal that triggers an active switch to control an entry of a source signal through a filter; and
the filter configured to modify the source signal to generate an output signal of the integrated power supply, the filter including an IC passive component located in the IC and a substrate integrated passive component located in the substrate, wherein a first capacity of the IC passive component and a second capacity of the substrate integrated passive component are configured based on a frequency of the PWM output signal and a current of the source signal; and
other integrated components configured to receive the output signal from the filter and operate based on the output signal, the other integrated components including an integrated high-voltage driver, a modulator bias source, an active bias tee, a negative power supply, a clock and data recovery circuit, a post amplifier, an analog-to-digital converter, a microcontroller, and a digital-to-analog converter that are integrated into the same IC using the OG EDCMOS technology.

11. The optical assembly of claim 10, wherein the substrate includes a substrate transmission line configured to communicate the output signal from the IC to a first component located in the substrate or to a second component located off the substrate.

12. The optical assembly of claim 10, wherein the PWM is constructed using OG EDCMOS technology.

13. The optical assembly of claim 12, wherein the PWM output signal includes a frequency of above 50 megahertz.

14. The optical assembly of claim 10, wherein the substrate comprises one of a low temperature co-fired ceramic ("LTCC") substrate and a high temperature co-fired ceramic ("HTCC") substrate.

15. The optical assembly of claim 10, wherein the source signal is received from a host power supply and has a voltage of about 3.3 volts.

16. The optical assembly of claim 10, wherein:
the substrate includes a substrate transmission line;
the source signal enters the IC through the active switch triggered by the PWM, passes through the active switch, and enters the IC passive component;
a first intermediate signal that is representative of the source signal exits the IC passive component and is communicated via the substrate transmission line to the substrate integrated passive component; and
a second intermediate signal that is representative of the first intermediate signal exits the substrate integrated passive component and is communicated via the substrate transmission line to the other integrated components.

17. An optical subassembly comprising:
a printed circuit board ("PCB");
a substrate mounted to the PCB; and
an integrated circuit ("IC") mounted to the substrate, the IC being constructed using an orthogonal gate extended drain complementary metal-oxide-semiconductor (OG EDCMOS) technology, the IC including:
an inverter that includes an integrated power supply configured to receive a source signal at an active switch from a host power supply and to output an output signal of the integrated power supply, the active switch being controlled by a pulse width modulator (PWM) output signal generated by a PWM which is integrated into the IC, the PWM output signal having a frequency above 50 megahertz, the integrated power supply including a filter configured to convert the source signal to the output signal, the filter including an IC passive component located in the IC and a substrate integrated passive component located in the substrate, wherein a first capacity of the IC passive component and a second capacity of the substrate integrated passive component are configured based on a frequency of the PWM output signal and a current of the source signal; and
other integrated components configured to receive the output signal from the filter and operate based on the output signal, the other integrated components including an integrated high-voltage driver, a modulator bias source, an active bias tee, a negative power supply, a clock and data recovery circuit, a post amplifier, an analog-to-digital converter, a microcontroller, and a digital-to-analog converter that are integrated into the same IC using the OG EDCMOS technology.

18. The optical subassembly of claim 17, wherein the filter is configured to receive the source signal from the active switch, and the filter further includes a PCB passive located on the PCB.

19. The optical subassembly of claim 17, wherein the other integrated components are constructed using complementary metal-oxide-semiconductor ("CMOS"), Bipolar CMOS ("BiCMOS"), extended drain CMOS ("EDMOS"), OG EDMOS, or Silicon-Germanium ("SiGe") heterojunction bipolar transistor ("HBT"), and wherein the other integrated components further include one or more of a transmitter driver, a receiver CDR, a receiver coupled to a transimpedance amplifier, a linear operational amplifier, a modulator driver, a variable optic attenuator controller, an electro-absorption bias controller, an electro-absorption bias monitor, an electro-absorption bias tee, a semiconductor optical amplifier controller, electrically erasable programmable read-only memory, a thermal electric cooler controller, an H-bridge, a temperature sensor circuit, or an inrush control.

20. The optical assembly of claim 18, wherein:
the substrate includes a substrate transmission line;
the source signal enters the IC through the active switch triggered by the PWM, passes through the active switch, and enters the IC passive component;
a first intermediate signal that is representative of the source signal exits the IC passive component and is communicated across the substrate via the substrate transmission line to the PCB passive component; and
a second intermediate signal that is representative of the first intermediate signal exits the PCB passive component and is communicated via the substrate transmission line to the other integrated components.

* * * * *